(12) United States Patent
Eom et al.

(10) Patent No.: US 12,292,185 B2
(45) Date of Patent: May 6, 2025

(54) LIGHTING MODULE, LIGHTING DEVICE AND LAMP

(71) Applicant: LG INNOTEK CO., LTD., Seoul (KR)

(72) Inventors: Dong Il Eom, Seoul (KR); Jung Ju Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/751,800

(22) Filed: Jun. 24, 2024

(65) Prior Publication Data

US 2024/0344683 A1    Oct. 17, 2024

Related U.S. Application Data

(63) Continuation of application No. 18/371,134, filed on Sep. 21, 2023, now Pat. No. 12,044,398, which is a
(Continued)

(30) Foreign Application Priority Data

Sep. 20, 2019 (KR) .................. 10-2019-0116308

(51) Int. Cl.
*F21V 9/30* (2018.01)
*F21V 7/05* (2006.01)
(Continued)

(52) U.S. Cl.
CPC .................. *F21V 9/30* (2018.02); *F21V 7/05* (2013.01); *F21Y 2105/10* (2016.08); *F21Y 2115/10* (2016.08)

(58) Field of Classification Search
CPC .. G02B 6/0031; G02B 6/0055; G02B 6/0068; G02B 6/0023; F21K 9/61;
(Continued)

(56) References Cited

U.S. PATENT DOCUMENTS 9,196,801 B2  11/2015  Kanemaru
9,412,920 B2   8/2016  Ooyabu et al.
(Continued)

FOREIGN PATENT DOCUMENTS

CN    102738368 A    10/2012
CN    109964323 A    7/2019
(Continued)

OTHER PUBLICATIONS

International Search Report dated Dec. 30, 2020 issued in Application No. PCT/KR2020/012467.
(Continued)

*Primary Examiner* — William J Carter
(74) *Attorney, Agent, or Firm* — KED & ASSOCIATES, LLP

(57) ABSTRACT

A lighting device disclosed in an embodiment of the invention includes: a substrate; a plurality of light emitting devices disposed on the substrate; a first reflective member disposed on the substrate; a resin layer disposed on the first reflective member; a second reflective member disposed on the resin layer; and a wavelength conversion layer disposed on one surface of the resin layer opposite to the light emitting surface of the light emitting device, wherein a distance from the light emitting surface to the one surface may be 5 to 10 times a height of the resin layer.

20 Claims, 16 Drawing Sheets

Related U.S. Application Data continuation of application No. 17/761,650, filed as application No. PCT/KR2020/012467 on Sep. 16, 2020, now Pat. No. 11,796,154.

(51) Int. Cl.
  *F21Y 105/10* (2016.01)
  *F21Y 115/10* (2016.01)

(58) Field of Classification Search
  CPC ......... G02F 1/133615; G02F 1/133603; G02F 1/133606; G02F 1/133609; G02F 1/133605; F21V 9/30; F21V 7/05; F21Y 105/10; F21Y 115/12
  See application file for complete search history.

(56) References Cited

U.S. PATENT DOCUMENTS

| | | | |
|---|---|---|---|
| 9,484,509 B2 | 11/2016 | Kanemaru | |
| 9,568,664 B2 | 2/2017 | Cho et al. | |
| 10,297,725 B2 | 5/2019 | Kim et al. | |
| 11,164,993 B2 | 11/2021 | Kang et al. | |
| 11,450,786 B2 | 9/2022 | Kang et al. | |
| 11,658,266 B2 | 5/2023 | Kang et al. | |
| 2006/0002146 A1* | 1/2006 | Baba | G02F 1/133603 362/613 |
| 2007/0109792 A1* | 5/2007 | Chosa | G02B 6/0031 257/E25.02 |
| 2007/0274096 A1 | 11/2007 | Chew et al. | |
| 2011/0018020 A1 | 1/2011 | Jagt | |
| 2011/0050556 A1 | 3/2011 | Bae et al. | |
| 2011/0050558 A1* | 3/2011 | Park | G02F 1/133606 362/235 |
| 2012/0249925 A1 | 10/2012 | Yang | |
| 2012/0261700 A1 | 10/2012 | Ooyabu et al. | |
| 2012/0300452 A1 | 11/2012 | Harbers | |
| 2013/0320380 A1 | 12/2013 | Kanemaru | |
| 2014/0307470 A1* | 10/2014 | Horiuchi | G02B 6/0031 362/609 |
| 2016/0020368 A1 | 1/2016 | Kanemaru | |
| 2016/0170120 A1* | 6/2016 | Shani | G02F 1/133614 362/607 |
| 2019/0088824 A1 | 3/2019 | Kim et al. | |
| 2019/0097094 A1 | 3/2019 | Han et al. | |
| 2020/0335660 A1 | 10/2020 | Kang et al. | |
| 2022/0020897 A1 | 1/2022 | Kang et al. | |
| 2022/0393064 A1 | 12/2022 | Kang et al. | |
| 2023/0317875 A1 | 10/2023 | Kang et al. | |

FOREIGN PATENT DOCUMENTS

| | | |
|---|---|---|
| EP | 3712969 | 9/2020 |
| EP | 4 343 865 A2 | 3/2024 |
| JP | 2009-206064 | 9/2009 |
| JP | 2013-251393 | 12/2013 |
| JP | 2019-061954 | 4/2019 |
| KR | 10-2013-0096208 A | 8/2013 |
| KR | 2014-0095723 | 8/2014 |
| KR | 10-2015-0092793 | 8/2015 |
| KR | 10-2015-0130809 | 11/2015 |
| KR | 10-2019-0035491 A | 4/2019 |
| KR | 10-2019-0054605 | 5/2019 |

OTHER PUBLICATIONS

Chinese Office Action dated Jun. 1, 2023 issued in Application 202080066159.7.
U.S. Office Action dated Mar. 15, 2023 issued in U.S. Appl. No. 17/761,650.
Extended European Search Report dated Sep. 27, 2023 issued in Application No. 20865364.2.
U.S. Notice of Allowance dated Mar. 25. 2024 issued in U.S. Appl. No. 18/371,134.
Japanese Office Action dated Aug. 6, 2024 issued in Application No. 2022-515839.
Korean Office Action dated Jan. 8, 2025 issued in Application 10-2019-0116308.

\* cited by examiner

LIGHTING MODULE, LIGHTING DEVICE AND LAMP

CROSS-REFERENCE TO RELATED APPLICATIONS

This application is a Continuation Application of U.S. patent application Ser. No. 18/371,134 filed Sep. 21, 2023, which is a continuation application of U.S. application Ser. No. 17/761,650, filed on Mar. 18, 2022, which is a U.S. National Stage Application under 35 U.S.C. § 371 of PCT Application No. PCT/KR2020/012467, filed Sep. 16, 2020, which claims priority to Korean Patent Application No. 10-2019-0116308, filed Sep. 20, 2019, whose entire disclosures are hereby incorporated by reference.

BACKGROUND

1. Field

An embodiment of the invention relates to a lighting module having a plurality of light emitting devices. Embodiments of the invention relate to a lighting module emitting surface light on different planes, a lighting apparatus having the lighting module, a light unit, a display device, and a vehicle lamp.

2. Background

Lighting applications include vehicle lights as well as backlights for displays and signs. Light emitting device, such as light emitting diode (LED), have advantages such as low power consumption, semi-permanent life, fast response speed, safety, and environmental friendliness compared to conventional light sources such as fluorescent lamps and incandescent lamps. These light emitting diodes are applied to various display devices, various lighting devices such as indoor or outdoor lights. Recently, as a vehicle light source, a lamp employing a light emitting diode has been proposed. Compared with incandescent lamps, light emitting diodes are advantageous in that power consumption is small. However, since an emission angle of light emitted from the light emitting diode is small, when the light emitting diode is used as a vehicle lamp, there is a demand for increasing the light emitting area of the lamp using the light emitting diode. Since the light emitting diode is small, it may increase the design freedom of the lamp, and it is economical due to its semi-permanent life.

BRIEF DESCRIPTION OF THE DRAWINGS

The embodiments will be described in detail with reference to the following drawings in which like reference numerals refer to like elements wherein.

DETAILED DESCRIPTION

Figure 1:
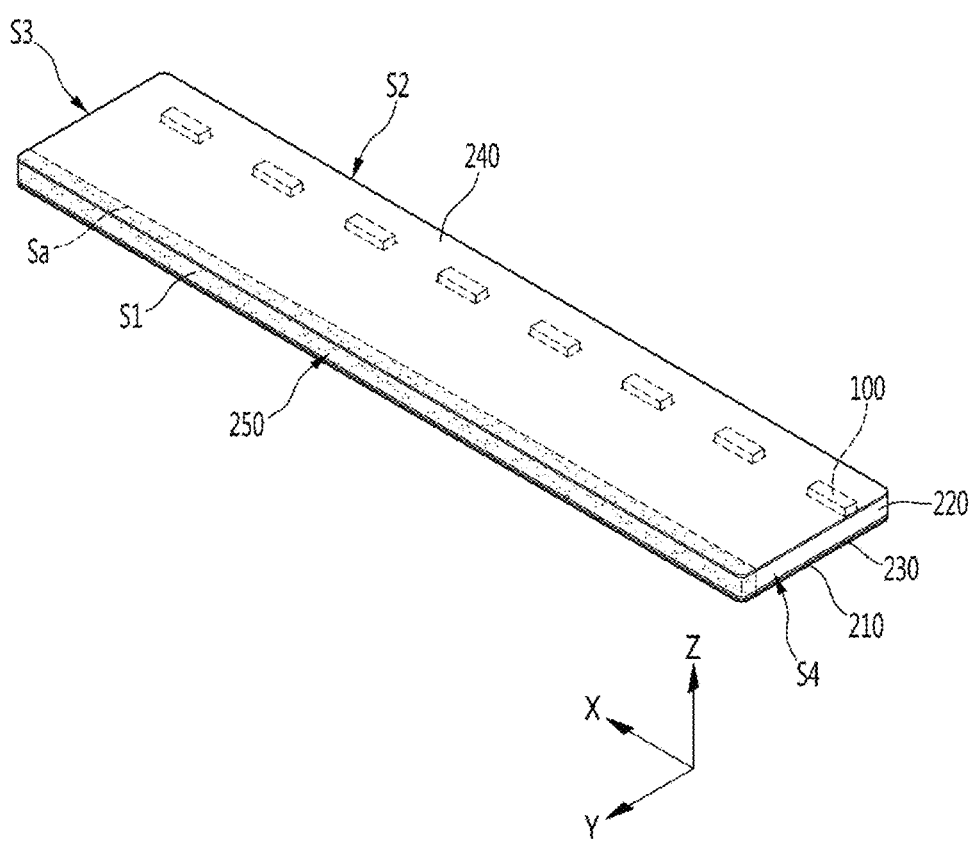
FIG. 1 is a perspective view showing a lighting device according to a first embodiment of the invention.

Hereinafter, with reference to the accompanying drawings will be described in detail preferred embodiments that may be easily carried out by the person of ordinary skill in the art. However, it should be understood that the configurations shown in the embodiments and drawings described in this specification are only preferred embodiments of the invention, and that there may be various equivalents and modifications that can replace them at the time of application. In the detailed description of the operating principle for the preferred embodiment of the invention, when it is determined that a detailed description of related known functions or configurations may unnecessarily obscure the subject matter of the invention, the detailed description will be omitted. Terms to be described later are terms defined in consideration of functions in the invention, and the meaning of each term should be interpreted based on the contents throughout the present specification. The same reference numerals are used for parts having similar functions and functions throughout the drawings. The lighting device according to the invention may be applied to various lamp devices that require lighting, such as vehicle lamps, household lighting devices, and industrial lighting devices. For example, when applied to vehicle lamps, it is applicable to head lamps, car width lights, side mirror lights, fog lights, tail lamps, brake lights, daytime running lights, vehicle interior lights, door scars, rear combination lamps, backup lamps, etc. The lighting device of the invention may be applied to indoor and outdoor advertising devices, display devices, and various electric vehicle fields. In addition, it may be applied to all lighting-related fields or advertising-related fields that are currently developed and commercialized or may be implemented according to future technological development. Hereinafter, the embodiments will be apparent through the description of the accompanying drawings and embodiments. In the description of the embodiments, each layer (film), region, pattern or structure is formed "on" or "under" of the substrate, each layer (film), region, pad or patterns. In the case described as, "on" and "under" include both "directly" or "indirectly" formed through another layer. In addition, the criteria for the top or bottom of each layer will be described based on the drawings.

<Lighting Module or Lighting Device>

Figure 2:
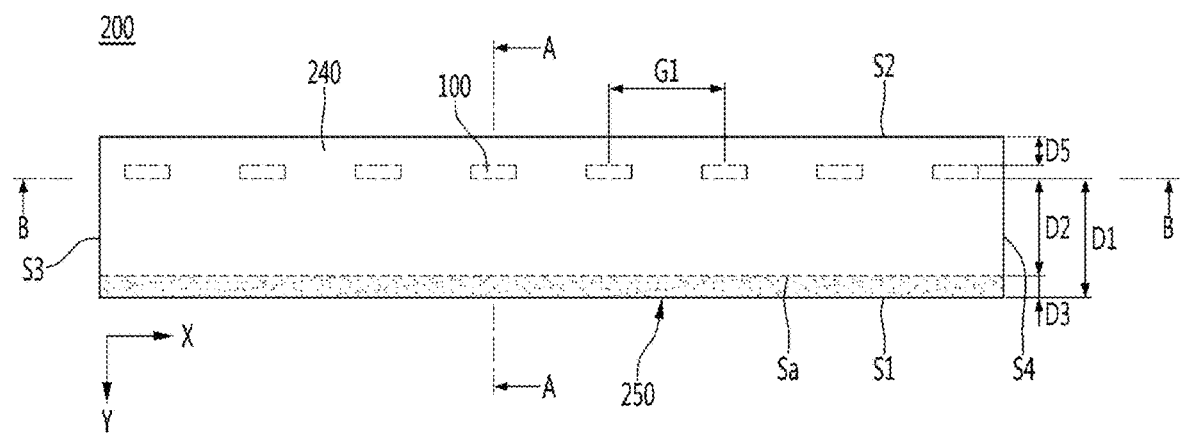
FIG. 2 is a plan view of the lighting device of FIG. 1.
Figure 3:
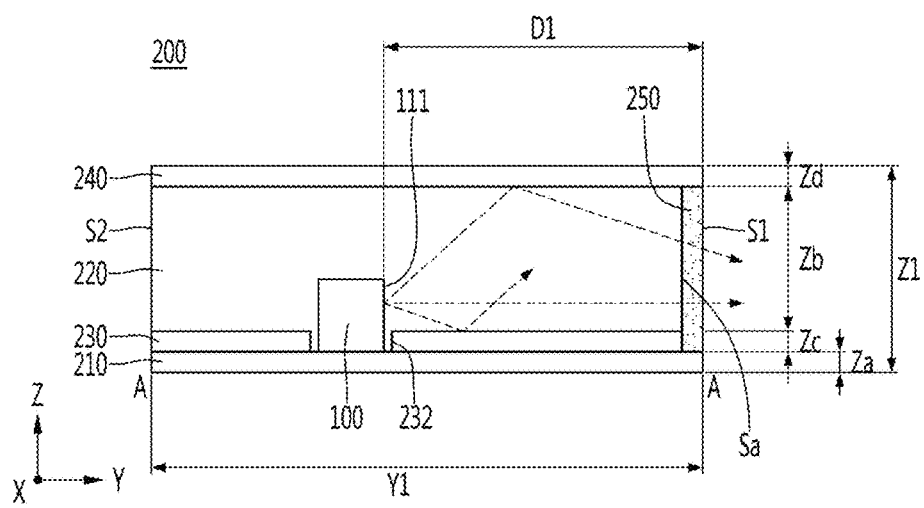
FIG. 3 is a cross-sectional view on an A-A side of the lighting device of FIG. 2.
Figure 4:
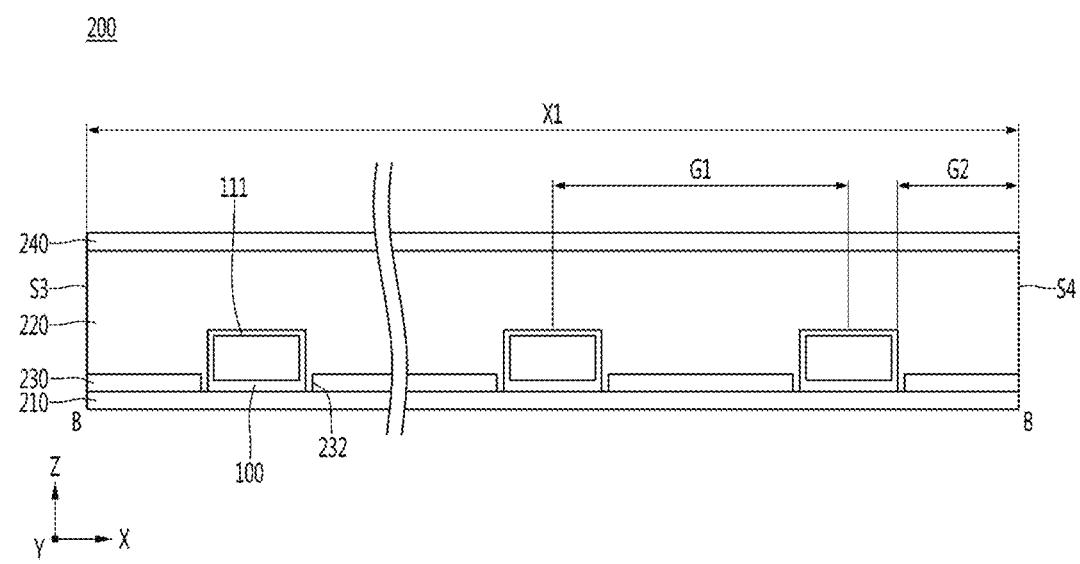
FIG. 4 is a cross-sectional view on a B-B side of the lighting device of FIG. 2.
Figure 5:
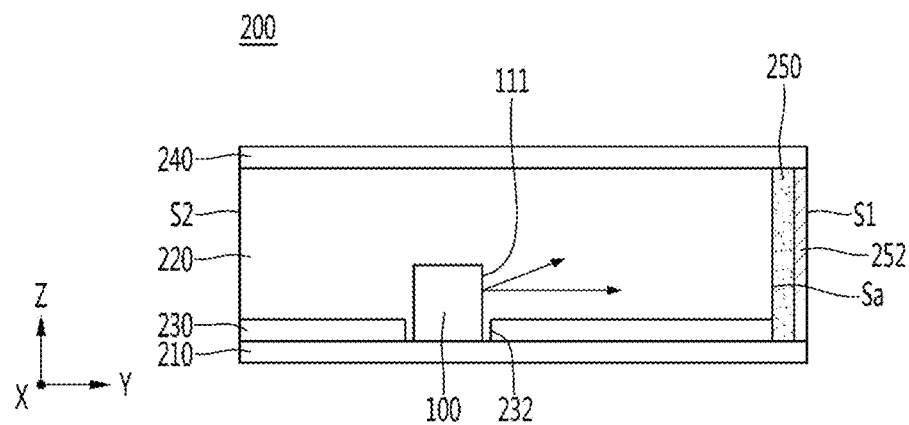
FIG. 5 is a first modified example of an exit portion of the lighting device of FIG. 3.
Figure 6:
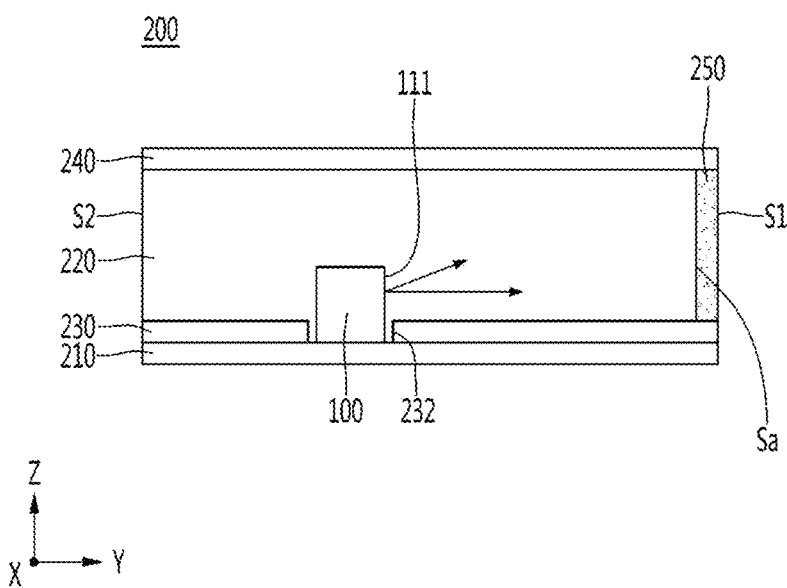
FIG. 6 is a second modified example of an exit portion of the lighting device of FIG. 3.
Figure 7:
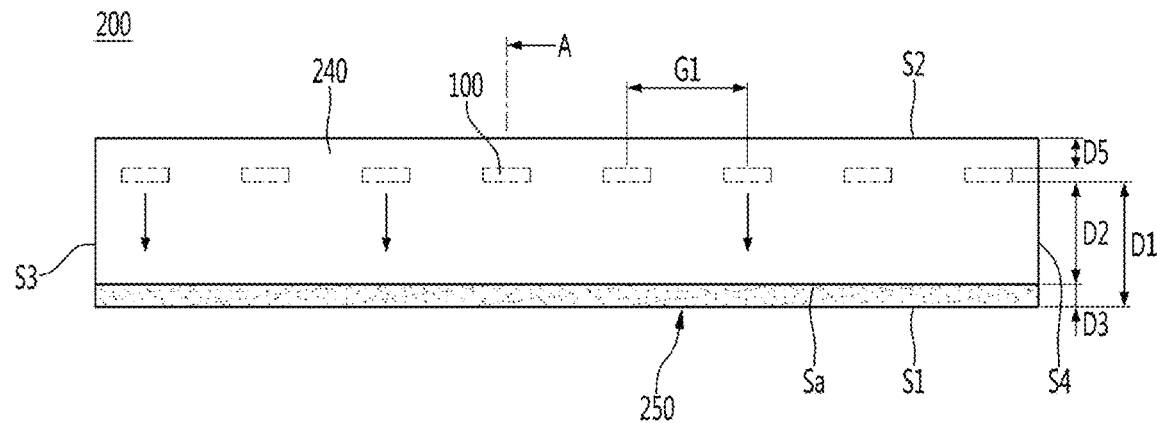
FIG. 7 is another example of the lighting device of FIG. 2.

FIG. 1 is a perspective view of a lighting device according to a first embodiment of the invention, FIG. 2 is a plan view of the lighting device of FIG. 1, FIG. 3 is a cross-sectional view on the A-A side of the lighting device of FIG. 2, and FIG. 4 is a cross-sectional view on the B-B side of the lighting device, FIG. 5 is a first modified example of the first exit surface of the lighting device of FIG. 3, FIG. 6 is a second modified example of the first exit surface of the lighting device of FIG. 3, and FIG. 7 is another example of the lighting device of FIG. 2, and FIGS. 8 to 13 are modified examples of side cross-sectional views of the lighting device of FIG. 7.

Referring to FIGS. 1 to 6, the lighting module or device 200 according to an embodiment of the invention may include a substrate 210, a resin layer 220, a wavelength conversion layer 250 and a plurality of light emitting devices 100. In the lighting device 200, a second reflective member 240 may be disposed on at least one or both of the resin layer 220 and the wavelength conversion layer 250. The lighting module 200 may include a first reflective member 230 under at least one or both of the resin layer 220 and the wavelength conversion layer 250. The first reflective member 230 may be disposed on the substrate 210 and may be disposed under the resin layer 220. The first and second reflective members 230 and 240 may reflect incident light.

The light emitted from the light emitting device 100 may be emitted in the form of a surface through at least one of the side surfaces of the resin layer 220 or through the wavelength conversion layer 250. The lighting module 200 may have a line-shaped side(s), an emitting surface, or a transparent surface disposed around the plurality of light emitting devices 100. The lighting module 200 may be provided with an exit surface having a predetermined height or thickness on one surface facing the light emitting surface of the plurality of light emitting devices 100. At least one side and one surface (or upper surface) of the resin layer 220 may be exposed, and at least one side and one surface (or upper surface) and/or the other surface (or lower surface) of the wavelength conversion layer 250 may be exposed. The lighting module or device 200 may include a first surface S1 and a second surface S2 disposed on opposite sides of each other, and a third surface S3 and a fourth surface S4 disposed on opposite sides of each other. The first and second surfaces S1 and S2 may extend with a long length in the first direction, and the third and fourth surfaces S3 and S4 may extend with a long length in the second direction. have. The first and second directions may be orthogonal to each other or may cross each other at an acute angle or an obtuse angle. The third direction may be a vertical direction or a thickness direction, and may be a direction orthogonal to the first and second directions. In the lighting module 200, at least a portion of the first surface S1 and the second surface S2 may face each other or be disposed to be shifted. At least a portion of the third surface S3 and the fourth surface S4 may face each other or be displaced. The third surface S3 and the fourth surface S4 may be different from the first surface S1 and the second surface S2. The minimum distance between the first surface S1 and the second surface S2 may be smaller than the minimum distance between the third surface S3 and the fourth surface S4.

In the lighting module 200, the first surface S1 and the second surface S2 may have a long length in one direction or the first direction X, and may extend long in a bar shape or a line shape. The first surface S1 may be a surface opposite to the light emitting surface 111 of the light emitting device 100 or a surface from which light having the highest luminous intensity among the side surfaces of the resin layer 220 or the wavelength conversion layer 250 is emitted. The first surface S1 may be a first exit surface facing the light emitting surface 111. Here, the light emitting device 100 has been described as a light emitting surface 111 with a side surface in a single direction, but may emit light on two or more surfaces or four or more surfaces depending on the type of device or light source. In the lighting module or device 200, the plurality of light emitting devices 100 may be arranged in a first direction or along a region adjacent to the second surface S2. The plurality of light emitting devices 100 may be arranged in at least one row. The virtual line connecting the light emitting devices 100 arranged in at least one row may be a straight line or include a curve. As another example, the plurality of light emitting devices may be arranged in two rows, and the light emitting devices in the first and second rows are disposed between the first surface S1 and the second surface S2 in a column direction (e.g., Y direction) may be arranged so as not to overlap each other. The plurality of light emitting devices 100 arranged in the first direction X may face the first surface S1 or the first emission surface, respectively. Each light emitting surface 111 of the plurality of light emitting devices 100 may face the first exit or the first surface S1. The light emitted from the light emitting device 100 may be emitted through the first surface S1, and some light is transmitted through the second surface S2, the third surface S3 and/or the fourth surface S4.

As shown in FIGS. 2 to 5, in the lighting module 200, a first length X1 in the first direction X may be longer than a second length Y1 in the second direction Y. The first length X1 may vary depending on the number of arrangements of the light emitting devices 100, and may be, for example, 30 mm or more. The second length Y1 in the second direction may be 13 mm or more, or 16 mm or more, or 20 mm or less. The second length Y1 of the lighting module 200 may provide a region in which the emitted light of the light emitting device 100 is diffused and a region protecting the rear of the light emitting device 100. Here, when the minimum interval between the two adjacent light emitting devices 100 is G1, the first length X1 may be greater than twice the distance G1, and the second length Y1 may be may be less than twice the distance G1. The distance G1 may be 10 mm or more, for example, in the range of 10 mm to 15 mm.

As shown in FIGS. 2 and 3, the distance D1 between the first surface S1 and the light emitting surface (or one surface) of the light emitting device 100 and a distance D5 between the other surface of the light emitting device 100 and the second surface S2 may be different from each other, and for example, may have a relationship of D1>D5. The distance D5 between the light emitting device 100 and the second surface S2 may be 3 mm or more, for example, 3 mm to 20 mm. When the distance D5 between the light emitting device 100 and the second surface S2 is smaller than the above range, the region in which moisture may penetrate or form a circuit pattern may be reduced, and when larger than the above range, the lighting module 200 may be increased. In the lighting module 200, the first surface S1, the second surface S2, the third surface S3 and the fourth surface S4 are provided in a plane perpendicular to the third direction Z, or at least one of the first to fourth surfaces S1 to S4 may include a curved surface or an inclined surface. The first surface S1, the second surface S2, the third surface S3, and the fourth surface S4 may have the same thickness or the same height in the third direction Z. For example, the first surface S1 as the first exit surface may be a vertical plane or may include a convex curved surface having a curvature. The resin layer 220 may include the second surface S2, the third surface S3 and the fourth surface S4, and the wavelength conversion layer 250 may include the first surface S1, a third surface S3 and a fourth surface S4.

A wavelength conversion layer 250 may be disposed outside the resin layer 220. The first to fourth surfaces S1, S2, S3, and S4 may be the outermost surfaces of the resin layer 220 or the wavelength conversion layer 250. The wavelength conversion layer 250 may be disposed on the side surface of the first surface S1, or may be disposed on a part or the entire side surface of the third surface S3 and/or the fourth surface S4. When the wavelength conversion layer 250 is in contact with the outer surface of the resin layer 220, the boundary surface Sa between the wavelength conversion layer 250 and the resin layer 220 may be disposed along the region where the wavelength conversion layer 250 is formed. For example, the boundary surface Sa may be disposed along the first surface S1 or along portions of the first surface S1, the third and fourth surfaces S3 and S4. That is, the wavelength conversion layer 250 may be disposed on a surface corresponding to the first, third, and fourth surfaces S1, S3 and S4 of the resin layer 220. The resin layer 220 may be disposed to surround a device disposed on the substrate 210, for example, one or a plurality of light emitting devices 100. The resin layer 220 may seal the light emitting devices 100. The resin layer 220 may be in contact with the light emitting devices 100. At least three or more of the plurality of light emitting devices 100 may be arranged in the first direction, and may be disposed in the resin layer 220. The plurality of light emitting devices 100 may be disposed between the substrate 210 and the second reflective member 240. The resin layer 220 may be made of a light-transmitting material such as silicone or epoxy. The resin layer 220 may include a glass material as another material. The resin layer 220 may be a layer having no impurities or may include impurities such as a diffusion agent. The first reflective member 230 may be disposed between the resin layer 220 and the substrate 210. The first reflective member 230 may not be formed, and a reflective material may be formed on the upper surface of the substrate 210.

The substrate 210 includes a printed circuit board (PCB), for example, a resin-based printed circuit board (PCB), a metal core PCB, a flexible PCB, and a ceramic PCB, or a FR-4 substrate. The substrate 210 may be a flexible or non-flexible substrate. A circuit pattern may be disposed on the substrate 210. The circuit pattern of the substrate 210 may include a plurality of pads in a region corresponding to the light emitting device 100. The plurality of light emitting devices 100 may be electrically connected to the substrate 210. The plurality of light emitting devices 100 may have a bonding portion disposed thereunder, and the bonding portion may be electrically connected to the pad of the substrate 210. The plurality of light emitting devices 100 may be connected in series by a circuit pattern of the substrate 210. As another example, the plurality of light emitting devices 100 may be connected in parallel by a circuit pattern of the substrate 210, or two or more groups connected in series may be connected in parallel. Among the regions of the substrate 210, a rear region with respect to the light emitting device 100 is a region opposite to a region from which light is emitted, and circuit patterns for connecting the light emitting devices 100 may be disposed. The width of the rear region may vary according to the number of the light emitting devices 100 or a connection method of the light emitting devices 100. The width of the rear region is the distance D5 between the light emitting device 100 and the second surface S2, and may be 3 mm or more. Accordingly, a circuit pattern for connecting the plurality of light emitting devices 100 and suppressing moisture penetration from the rear of the light emitting device 100 may be formed.

The light emitting device 100 may include a device including a light emitting chip or a package in which an LED chip is packaged. The light emitting chip may emit at least one of blue, red, green, and ultraviolet (UV) light. The light emitting device 100 may emit at least one of white, blue, red, and green. The light emitting device 100 may emit light in a lateral direction, and a bottom portion may be disposed on the substrate 210. For example, the light emitting device 100 may be a side view type package or a package having one side of the light emitting surface 111. As another example, the light emitting device 100 may be an LED chip, and one surface of the LED chip may be opened and a reflective member may be disposed on the other surface. Alternatively, an LED chip may be disposed on the substrate 210, and light may be emitted through an upper surface and side surfaces of the LED chip. The light emitting surface 111 of the light emitting device 100 may be disposed on a surface adjacent to the substrate 210, for example, on a side adjacent to the upper surface of the substrate 210. The light emitting surface 111 is disposed on a side surface between the bottom and the upper surface of the light emitting device 100, and emits light in the second direction Y. The light emitting surface 111 of the light emitting device 100 may be adjacent to the first reflective member 230 and may be a surface perpendicular to the upper surface of the substrate 210 and the upper surface of the first reflective member 230. The height of the light emitting device 100 may be in the range of 1 mm to 2 mm, for example, in the range of 1.2 mm to 1.8 mm. As shown in FIGS. 2 and 4, the pitch G1 between the light emitting devices 100 may be 10 mm or more, for example, in the range of 10 mm to 15 mm. In addition, the distance G2 between the outermost light emitting device 100 and the third or fourth side surfaces S3 and S4 of the resin layer 220 may be smaller than the pitch G1, and may be 10 mm or less. Here, the distance D1 may be 90% or more of the pitch G1, for example, in a range of 90% to 120%, and the pitch G1 may vary according to the distance D1.

The length of the light emitting device 100 in the first direction X may be greater than the height of the light emitting device 100, for example, 1.5 times or more of the height of the light emitting device 100. Since the light emitting device 100 has a low height and a long length in the first direction X, the light emission angle in the first direction X, which is the left-right direction, based on the center of the light emitting device 100 may be provided widely. Here, the light emission angle in the first direction X of the light emitting device 100 may be greater than the light emission angle in the third direction Z, which is an up-down direction.

The light emission angle of the light emitting device 100 in the second direction Y may range from 110 degrees to 160 degrees. Here, as shown in FIG. 3, the thickness Za of the substrate 210 may be smaller than the height of the light emitting device 100. The height of the light emitting device 100 may be at least twice the thickness Za of the substrate 210, for example, in the range of 2 to 4 times. Since the thickness Za of the substrate 210 is thin, the lighting module 200 may be provided as a flexible plate.

The resin layer 220 may cover the light emitting device 100 on the substrate 210. The second reflective member 240 may cover the upper surface of the resin layer 220. The resin layer 220 may be in contact with the upper surface and side surfaces of the light emitting device 100. The resin layer 220 may be in contact with the upper surface of the first reflective member 230. A portion of the resin layer 220 may be in contact with the substrate 210 through the hole 232 of the first reflective member 230. The resin layer 220 may be in contact with the light emitting surface 111 of the light emitting device 100. The first surface S1, the second surface S2, the third surface S3, and the fourth surface S4 of the resin layer 220 may be side surfaces between the first and second reflective members 230 and 240. The upper surface area of the resin layer 220 may be the same as the upper surface area of the substrate 210, the upper surface area of the first reflective member 230, or the lower surface area of the second reflective member 240. The length of the resin layer 220 in the first direction may be the same as the length of the substrate 210, the length of the first reflective member 230, and/or the length of the second reflective member 240. The maximum width Y1 of the resin layer 220 in the second direction may be equal to the maximum width of the substrate 210, the maximum width of the first reflective member 230 or/and the maximum width of the second reflective member 240. As another example, the upper surface area of the resin layer 220 may be smaller than an upper surface area of the substrate 210. In this structure, the upper edge of the substrate 210 may protrude more outward than the lower edge of the resin layer 220. The resin layer 220 may be disposed between the first and second reflective members 230 and 240. A portion of the resin layer 220 may be disposed between the substrate 210 and the second reflective member 240. The upper surface of the first reflective member 230 and the lower surface of the second reflective member 240 may face each other on the lower surface and the upper surface of the resin layer 220. The upper surface of the first reflective member 230 and the lower surface of the second reflective member 240 may have the same area. Accordingly, the resin layer 220 may diffuse the light emitted from the light emitting device 100 and the light reflected by the first and second reflective members 230 and 240 to guide them in the lateral direction.

The resin layer 220 may be formed with a thickness Zb or a height greater than the height of the light emitting device 100. Accordingly, the resin layer 220 may protect the upper portion of the light emitting device 100 and suppress moisture penetration. Since the substrate 210 is disposed on the lower portion of the light emitting device 100 and the resin layer 220 is disposed on the upper portion of the light emitting device 100, the light emitting device 100 may be protected. Accordingly, the interval between the upper surface of the resin layer 220 and the light emitting device 100 may be 0.5 mm or less, for example, in the range of 0.2 mm to 0.5 mm. The thickness Zb of the resin layer 220 is the distance between the first and second reflective members 230 and 240, and the distance (e.g., Zb) between the first and second reflective members 230 and 240 may be smaller than the distance between the first surface S1 and the second surface S2. For example, the distance between the first surface S1 and the second surface S2 may include a maximum distance or a minimum distance. By arranging the distance between the first and second reflective members 230 and 240 to be smaller than the width Y1 or the minimum width in the second direction of the lighting module 200, a surface light in the form of a line may provide and the luminous intensity may improve and a hot spot may be prevented. In addition, it is possible to provide a lighting module that is flexible in the third direction. The thickness Zb of the resin layer 220 may be less than or equal to twice the thickness of the light emitting device 100, for example, more than 1 to 2 times or less. The thickness Zb of the resin layer 220 may be, for example, in the range of 1.5 mm to 1.9 mm or in the range of 1.5 mm to 1.6 mm. The thickness Zb of the resin layer 220 may be 0.8 times or less of the thickness Z1 of the lighting module 200, and for example, it may be in range of 0.4 times to 0.8 times the thickness Z1 of the lighting module 200. Since the resin layer 220 is disposed with a difference of 1.2 mm or less from the thickness Z1 of the lighting module 200, it is possible to prevent a decrease in light efficiency in the lighting module 200 and to strengthen the ductility characteristics. The resin layer 220 may include at least one of silicon, a silicone molding compound (SMC), an epoxy, and an epoxy molding compound (EMC). The resin layer 220 may include a UV (ultra violet) curable resin or a thermosetting resin material, for example, may selectively include PC, OPS, PMMA, PVC, and the like. For example, the main material of the resin layer 220 may be a resin material having a urethane acrylate oligomer as a main material. A bead (not shown) may be included in the resin layer 220, and the bead may diffuse and reflect incident light to increase the amount of light. The resin layer 220 may include a phosphor. The phosphor may be lower than the amount of phosphor added to the other resin layers, and may include at least one of yellow, green, blue, and red phosphors.

The first reflective member 230 may reflect the light emitted from the light emitting device 100. The first reflective member 230 may be formed on the upper surface of the substrate 210. The first reflective member 230 may be formed as an upper layer of the substrate 210 or as a separate layer. The first reflective member 230 may be adhered to the upper surface of the substrate 210 with an adhesive. The resin layer 220 may be adhered to the upper surface of the first reflective member 230. The first reflective member 230 has a plurality of holes 232 in a region corresponding to the lower surface of the light emitting device 100, and the light emitting device 100 may be connected to the substrate 210 through the holes 232. A portion of the resin layer 220 may be in contact with the substrate 210 through the hole 232. The hole 232 may be a region in which the light emitting device 100 is bonded to the substrate 210. The first reflective member 230 may have a single-layer or multi-layer structure. The first reflective member 230 may include a material that reflects light, for example, a metal or a non-metal material. When the first reflective member 230 is a metal, it may include a metal layer such as stainless steel, aluminum (Al), or silver (Ag), and in the case of a non-metallic material, it is a white resin material. The resin may be a material filled with metal oxide and/or air, or may include a plastic material. The first reflective member 230 may include a white resin material or a polyester (PET) material. The first reflection member 230 may include at least one of a low reflection film, a high reflection film, a diffuse reflection film, and a regular reflection film. The first reflective member 230 may be provided as, for example, a regular reflective film for reflecting the incident light to the first surface S1.

One end of the first reflective member 230 may be disposed on the same plane as the first surface S1. The other end of the first reflective member 230 may be disposed on the same plane as the second surface S2. As another example, one end and the other end of the first reflective member 230 may be spaced apart from the first surface S1 and the second surface S2 and may be in contact with the resin layer 220. That is, the outside of the first reflective member 230 may be covered with the resin layer 220 to prevent moisture from penetrating. A thickness Zc of the first reflective member 230 may be smaller than a thickness Za of the substrate 210. The thickness Zc of the first reflective member 230 is greater than or equal to 0.3 times the thickness Za of the substrate 210 to reduce transmission loss of incident light. The thickness Zc of the first reflective member 230 may be in the range of 0.1 mm to 0.3 mm, and when it is smaller than the range, light transmission loss may occur, and when it is thicker than the range, the thickness Z1 of the lighting module 200 may increase. A thickness Zd of the second reflective member 240 may be smaller than a thickness Za of the substrate 210. The thickness Zd of the second reflective member 240 is greater than or equal to 0.3 times the thickness Za of the substrate 210 to reduce transmission loss of incident light. The thickness Zd of the second reflective member 240 may be in the range of 0.1 mm to 0.3 mm, and when it is smaller than the above range, light transmission loss may occur, and when it is thicker than the above range, the thickness Z1 of the lighting module 200 may increase. The second reflective member 240 may be disposed on the entire upper surface of the resin layer 220 to reduce light loss. The second reflective member 240 may be made of the same material as the first reflective member 230. In order to reflect light and reduce transmission loss of light, the second reflective member 240 may be made of a material having a higher light reflectance than that of the first reflective member 230 or may have a thicker thickness. The second reflective member 240 may have the same thickness as the first reflective member 230 or a thicker thickness. For example, the first and second reflective members 230 and 240 may be provided with the same material and the same thickness. The second reflective member 240 may be formed in a single-layer or multi-layer structure. The second reflective member 240 may include a material that reflects light, for example, a metal or a non-metal material. When the second reflective member 240 is a metal, it may include a metal layer such as stainless steel, aluminum (Al), or silver (Ag), when it is a non-metal, it may be a white resin material, a material in which metal oxide and/or air are filled in the resin, or may include a plastic material. The second reflective member 240 may include a white resin material or a polyester (PET) material. The second reflection member 240 may include at least one of a low reflection film, a high reflection film, a diffuse reflection film, and a regular reflection film. The second reflective member 240 may be provided as a regular reflective film so that, for example, incident light travels in the direction of the first surface S1. Here, a light extraction structure such as a concave-convex structure may be disposed on the first surface S1. Accordingly, the extraction efficiency of light emitted through the resin layer 220 may be improved. On the first surface S1, the first overlapping region overlapping the light emitting device 100 in the horizontal direction and the second overlapping region overlapping the region between the light emitting devices in the horizontal direction may be disposed on the same plane. As another example, the second overlapping region may be concave in a second surface direction than the first overlapping region, or the first overlapping region may protrude more convexly than the second overlapping region. The first surface S1 may be treated as a haze surface to diffuse light. The haze surface may be treated as a surface rougher than the other surface of the resin layer 220 to diffuse the emitted light. Since the lighting module 200 provides the thickness Z1 in the third direction in the form of a line, it has ductility and may provide surface light in the form of a line. The thickness Z1 of the lighting module 200 may be 3 mm or less. That is, the lighting module 200 may emit line-shaped surface light of 3 mm or less to at least one side surface. As another example, the lighting module 200 may be larger than 2 mm and may be arranged to be 6 mm or less, in which case the thickness of the lighting module 200 is increased, but the thickness of the resin layer 220 is increased to increase the line width and increase the light distribution region.

Referring to FIG. 3, on the thickness of each component in the lighting module 200, when the thickness of the substrate 210 is Za, the thickness of the resin layer 220 is Zb, and the thickness of the first reflective member 230 is Zc and the thickness of the second reflective member 240 is Zd, Zb>Za>Zd>Zc may have a relationship. A interval between the lower surface of the substrate 210 and the upper surface of the second reflective member 240 is the thickness Z1 of the lighting module 200. The thickness Zb may have a ratio of 0.4 to 0.8 of Z1, the thickness Za may have a ratio of 0.14 to 0.18 of Z1, and the thickness Zd or Zc may have a ratio of 0.08 to 0.12 of Z1. The Zb may have a ratio of 3.5 to 4 of Za. The Zb may have a ratio of 5.8 to 6.4 of Zc or Zd. By disposing the thickness Zb of the resin layer 220 thicker than the thickness Za of the substrate 210, the light emitting device 100 may be protected and light is diffused to guide it, and the ductility may be strengthened. In addition, since the first exit surface in the form of a line having a thickness Zb or a height of the resin layer 220 is provided, a line exit surface may be provided. The distance D1 between the light emitting surface 111 of the light emitting device 100 and the first surface S1 is 5 times or more, for example, in a range of 5 to 10 times the thickness Zb or the height of the resin layer 220. The distance D1 may be 10 mm or more, for example, in the range of 10 mm to 15 mm. When the distance D1 from the light emitting surface 111 to the first exit surface or the first emission surface of the light emitting device 100 is less than 5 times the thickness Zb of the resin layer 220, a distribution of the surface light source may not be uniform, and when it exceeds 10 times, the improvement efficiency of the distribution of the surface light source may be insignificant compared to the increase in the module size.

The wavelength conversion layer 250 may be disposed on an outer surface of the exit side of the resin layer 220. A first surface S1 may be disposed on the exit surface of the wavelength conversion layer 250. The wavelength conversion layer 250 may face the light emitting surfaces 111 of the plurality of light emitting devices 100. The thickness in the vertical direction of the wavelength conversion layer 250 may be equal to or greater than the thickness Zb of the resin layer 220. The thickness in the vertical direction of the wavelength conversion layer 250 may be provided as the sum of any one of the thickness Zb of the resin layer 220 and the thicknesses Za and Zd of the first and second reflective members 230 and 240. That is, the thickness in the vertical direction of the wavelength conversion layer 250 may be less than or equal to the distance between the upper surface of the substrate 210 and the second reflective member 240 or greater than or equal to the distance between the upper surface and the lower surface of the resin layer 220. An inner surface of the wavelength conversion layer 250 may be in contact with the resin layer 220, and a lower surface of the wavelength conversion layer 250 may be in contact with at least one or both of the substrate 210 and the first reflective member 230. The upper surface of the wavelength conversion layer 250 may be in contact with the second reflective member 240. Accordingly, the wavelength conversion layer 250 may cover the outer surface (i.e., Sa) of the resin layer 220 and block moisture penetrating from the outside. Here, the outer surface or the first surface S1 of the wavelength conversion layer 250 may be the same plane as the side surface of the substrate 210 and/or the second reflective member 240. The wavelength conversion layer 250 may have a width D3 of 0.7 mm or less in the second horizontal direction Y, for example, in the range of 0.3 mm to 0.7 mm or in the range of 0.3 mm to 0.5 mm. The width D3 may be smaller than the length Y1 of the resin layer 220 in the second direction, for example, 1/30 or less of D2. The wavelength conversion layer 250 may include a wavelength conversion means therein. The wavelength conversion means may include a phosphor and/or quantum dots. The phosphor or quantum dot may emit, for example, at least one or two or more of amber, yellow, green, red, or blue light. The content of the wavelength conversion means added to the wavelength conversion layer 250 may be added in the range of 13 wt % or more or 13 wt % to 60 wt % of the weight of the wavelength conversion layer 250. The content of the phosphor in the wavelength conversion layer 250 may be changed according to the emitted light intensity and wavelength conversion efficiency. The light emitted through the wavelength conversion layer 250 may be a mixture of the first light emitted from the light emitting device 100 and the second light wavelength converted in the wavelength conversion layer 250. The mixed light of the first light and the second light may be red or white. The wavelength conversion layer 250 may include a diffusion agent and/or ink particles. The ink particles may include at least one of metal ink, UV ink, and curing ink. The size of the ink particles may be smaller than the size of the phosphor. The surface color of the ink particles may be any one of green, red, yellow, or blue. The types of the ink particles are PVC (Poly vinyl chloride) ink, PC (Polycarbonate) ink, ABS (acrylonitrile butadiene styrene copolymer) ink, UV resin ink, epoxy ink, silicone ink, PP (polypropylene) ink, water-based ink, plastic ink, PMMA (poly methyl methacrylate) ink, PS (Polystyrene) ink can be selectively applied. Here, the width or diameter of the ink particles may be 5 µm or less, for example, in a range of 0.05 µm to 1 µm. At least one of the ink particles may be smaller than a wavelength of light. The material of the ink particles may include at least one color of red, green, yellow, and blue. For example, the phosphor may emit a red wavelength, and the ink particles may include a red color. Here, when the ink particles and the wavelength conversion means are added together in the wavelength conversion layer 250, the ink particles may lower the transmittance of incident light, and may provide an external color in the same color as the ink color in the power off mode. The content of the wavelength conversion means in the wavelength conversion layer 250 may be lowered to 20 wt % or less by the ink particles.

In the manufacturing process of the lighting module, for example, the light emitting device 100 is mounted on the substrate 210 and the first reflective member 230 is attached to the substrate 210. After the resin layer 220 is formed on the substrate 210, the wavelength conversion layer 250 may be formed. After the resin layer 220 and the wavelength conversion layer 250 are formed, the second reflective member 240 may be attached to the resin layer 220 and the wavelength conversion layer 250. As another example, after forming the resin layer 220, the second reflective member 240 may be attached, and then the wavelength conversion layer 250 may be formed on one side of the resin layer 220.

Figure 8:
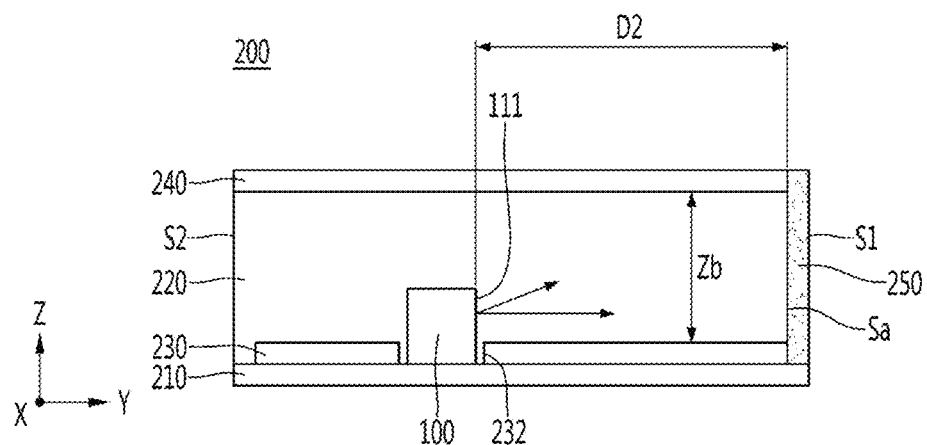
FIGS. 8 to 13 are modified examples of a cross-sectional side view of the lighting device of FIG. 7.

Referring to FIG. 5, the lighting module or device may include a resin layer 220, a wavelength conversion layer 250, and a colored ink layer 252 on the substrate 210. The wavelength conversion layer 250 may include a wavelength conversion means, and the colored ink layer 252 may include ink particles. The ink particles may lower the transmittance of light without converting the wavelength of light. In addition, since hot spots generated on the light emitting surface 111 of the light emitting device 100 may be visually recognized from the outside, the colored ink layer 252 lowers the transmittance of light to block and remove the hot spots. The colored ink layer 252 may provide an external color as an ink color when the power is turned off, and transmit the wavelength converted light by the wavelength converting means and the light emitted from the light emitting device 100 when the power is turned on. The colored ink layer 252 may face the light emitting surfaces 111 of the plurality of light emitting devices 100. The first surface S1 may be disposed on the outside of the colored ink layer 252, and the outer surface of the wavelength conversion layer 250 may be in contact with the inner surface. The colored ink layer 252 may be disposed on the first surface S1, or may be disposed on some or all of the first surface S1 and the third and fourth surfaces S3 and S4. As shown in FIGS. 2 and 5, the wavelength conversion layer 250 or the colored ink layer 252 disposed on the outermost side may further expand the emission area. The height or thickness of the colored ink layer 252 in the third vertical direction Z may be the same as the height or thickness of the wavelength conversion layer 250. The height or thickness of the colored ink layer 250 in the vertical direction Z may be equal to or greater than the height or thickness of the resin layer 220. A width of the colored ink layer 252 in the second horizontal direction Y may be smaller than a width of the wavelength conversion layer 250. An inner surface of the colored ink layer 252 may be in contact with the wavelength conversion layer 250, and a lower surface thereof may be in contact with at least one or both of the substrate 210 and the first reflective member 230. The upper surface of the colored ink layer 252 may be in contact with the second reflective member 240. Accordingly, the colored ink layer 252 may cover the outer surface of the wavelength conversion layer 220 and may reduce a difference between the color of the light emitted in the power on or off mode and the color of the non-emitted surface. Here, the outer surface or the first surface S1 of the colored ink layer 252 may be on the same plane as the side surface of the substrate 210 and/or the second reflective member 240. As shown in FIGS. 3 and 6, when the wavelength conversion layer 250 is disposed on the emission side of the light emitting device 100, the outer surface of the wavelength conversion layer 250, that is, the first surface S1 may be the same plane as the side surface of the substrate 210 and/or the second reflective member 240. As shown in FIG. 6, the wavelength conversion layer 250 may be disposed between the first and second reflective members 230 and 240 or may be in contact with the first and second reflective members 230 and 240. Here, the second reflective member 240 may expose a portion of the resin layer 220. The second reflective member 240 may expose a portion of the upper surface of the resin layer 220. As shown in FIGS. 7 and 8, the upper surface of the wavelength conversion layer 250 may be disposed outside the second reflective member 240 or may be exposed from the second reflective member 240. The inner surface of the wavelength conversion layer 250 may be in contact with the outer surface of the resin layer 220. The upper portion of the wavelength conversion layer 250 may be in contact with the side surface of the second reflective member 240, and may be at the same height as the upper surface of the second reflective member 240 or lower than the upper surface of the second reflective member 240. That is, the wavelength conversion layer 250 may further expand the emission area.

Figure 9:
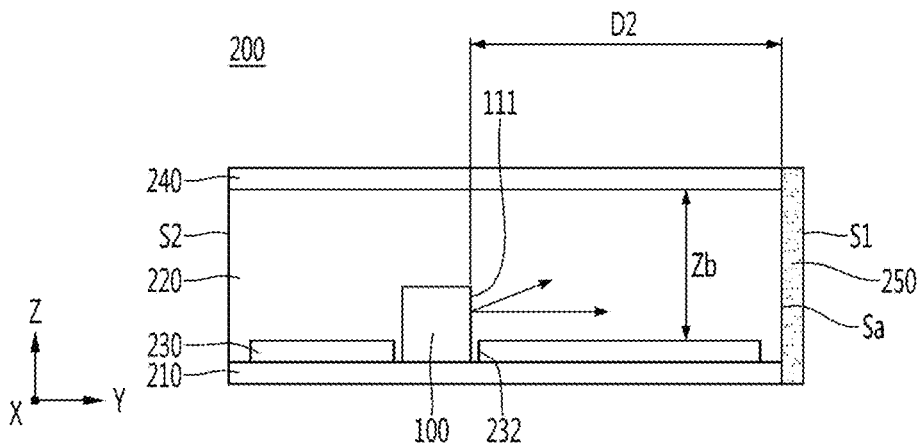

As shown in FIG. 9, the resin layer 220 may be in contact with the periphery of the upper surface of the substrate 210. The resin layer 220 may be in contact with a side surface of the first reflective member 230. The wavelength conversion layer 250 may be in contact with at least one of a side surface of the substrate 210, a side surface of the resin layer 220, and a side surface of the second reflective member 240 on the exit side. The wavelength conversion layer 250 may be disposed on the outside of the side surface of the substrate 210 and/or the second reflection member 240 to cover the exit-side region of the lighting module 200. A vertical height or thickness of the wavelength conversion layer 250 may be the same as the thickness of the lighting module 200. The wavelength conversion layer 250 is in contact with any one side of the lighting module 200 to suppress moisture penetration and suppress the problem that the second reflective member 240 is lifted. As shown in FIGS. 8 and 9, the wavelength conversion layer 250 may include the above-described wavelength conversion means, or may include the wavelength conversion means and ink particles.

Figure 10:
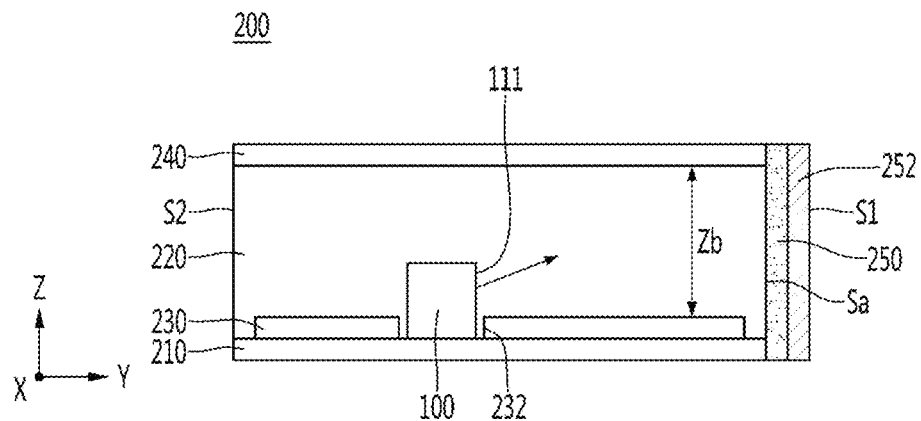
Figure 11:
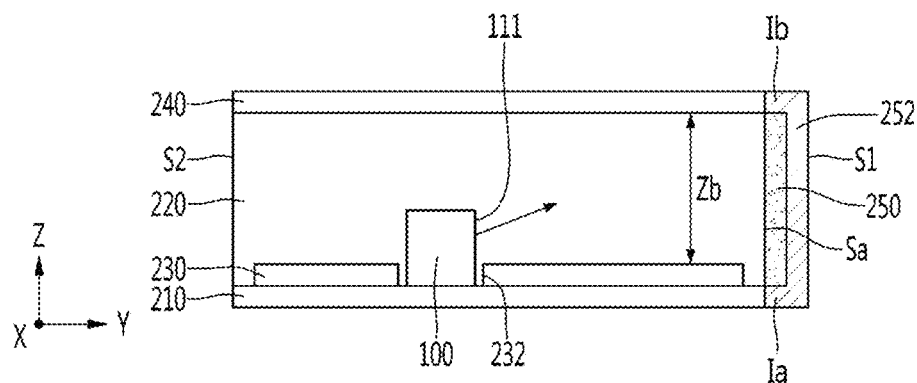
Figure 12:
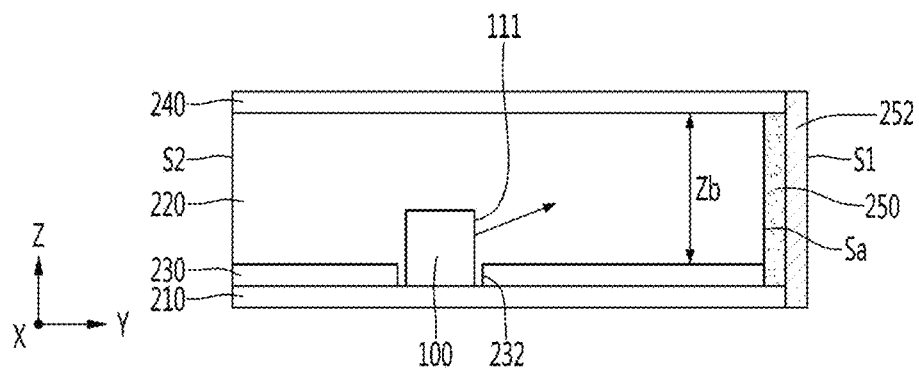
Figure 13:
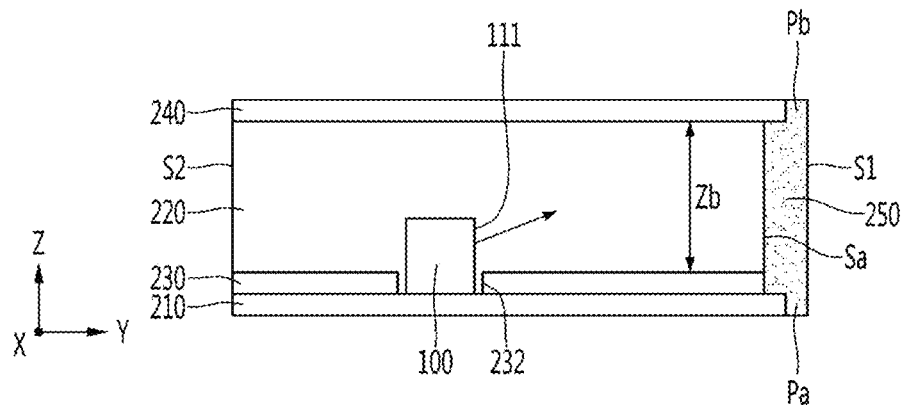

As shown in FIG. 10, the resin layer 220 may be in contact with the periphery of the upper surface of the substrate 210. The resin layer 220 may be in contact with a side surface of the first reflective member 230. The wavelength conversion layer 250 may be in contact with at least one of a side surface of the substrate 210, a side surface of the resin layer 220, and a side surface of the second reflective member 240 on the exit side. The wavelength conversion layer 250 may cover a side surface of the substrate 210 and/or the second reflective member 240. The colored ink layer 252 may be disposed outside the wavelength conversion layer 250 to cover the exit-side region of the lighting module 200. A vertical height or thickness of the wavelength conversion layer 250 and the colored ink layer 252 may be the same as the thickness of the lighting module 200. As shown in FIG. 11, the colored ink layer 252 is disposed on the outer surface of the wavelength conversion layer 250 and may include extension portions 1a and 1b extending to the lower surface and upper surface. The first extension portion 1a of the colored ink layer 252 may extend to the lower surface of the wavelength conversion layer 250 and may be in contact with the substrate 210. The second extension portion 1b of the colored ink layer 252 may extend to the upper surface of the wavelength conversion layer 250 and contact the first reflective member 240. As shown in FIG. 12, the colored ink layer 252 is disposed on the outer surface of the wavelength conversion layer 250, and may extend to and contact the side surface of the substrate 210 and/or the side surface of the second reflective member 240. Here, the wavelength conversion layer 250 is disposed between the substrate 210 and the second reflective member 240, and may be smaller than the vertical height of the colored ink layer 252. Aa shown in FIGS. 10 to 12, the wavelength conversion layer 250 may include the above-described wavelength conversion means, and the colored ink layer 252 may include the above-described ink particles. As shown in FIG. 13, the inside of the wavelength conversion layer 250 is disposed between the substrate 210 and the second reflective member 240 or protrudes toward the light emitting device 100, an upper portion Pb thereof may be disposed on the outside of the second reflective member 240, and the lower portion Pa thereof may be disposed on the outside of the substrate 210. The wavelength conversion layer 250 may be in contact with the outer surface of the resin layer 220, the lower edge and side surfaces of the second reflective member 240, and the lower surface edge and side surfaces of the substrate 210.

The material of the wavelength conversion layer 250 and/or the colored ink layer 252 includes a transparent material, and may be selectively formed from among the materials of the resin layer 220 disclosed above. The material of the wavelength conversion layer 250 and/or the colored ink layer 252 may be the same as that of the resin layer 220 or at least one may be different. In the lighting module(s) disclosed above, the second reflective member 240 may be removed when another device is disposed or a housing is disposed. The second reflective member 240 may be formed of a light blocking layer or a light blocking plate.

Here, the embodiment of the invention has been described as an example in which the wavelength conversion layer 250 is disposed or the wavelength conversion layer 250 and the colored ink layer 252 are disposed in the light exit direction or the horizontal direction from the resin layer 220. As another example, at least one or a plurality of layers of a resin material may be stacked on the resin layer 220 in a vertical direction. The one or more layers may be a single layer or a patterned layer having a pattern having a predetermined shape. The single layer or the pattern layer may be disposed on one surface and/or the other surface of the resin layer 220. For example, the single layer or the pattern layer may be disposed on a portion of the upper surface and/or a portion of the lower surface of the resin layer 220. This structure will be described in detail in the second embodiment.

Figure 14:
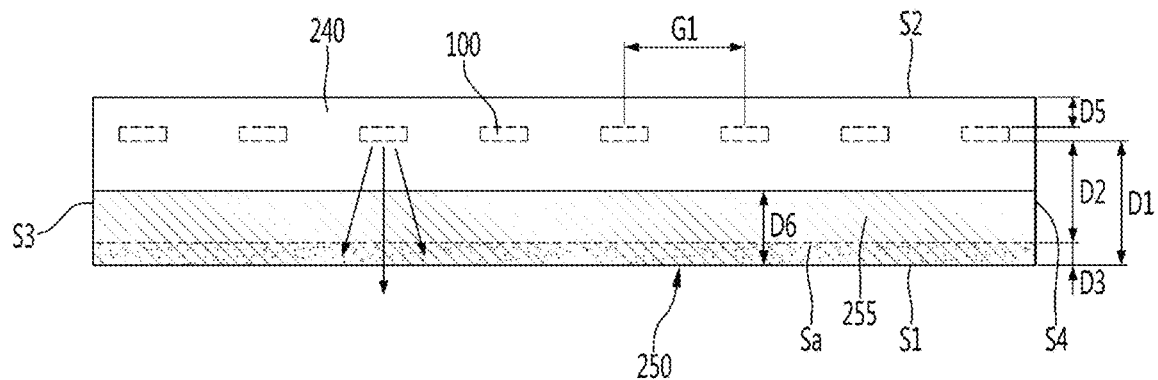
FIG. 14 is a plan view illustrating a lighting device according to the second embodiment.

FIG. 14 is a plan view showing a lighting module according to a second embodiment, FIGS. 15 to 20 are modified examples of side cross-sectional views of the lighting module of FIG. 14, and FIGS. 21 to 25 are other examples of a side cross-sectional view of a lighting module of FIGS. 1 and 7 or FIG. 14.

Figure 15:
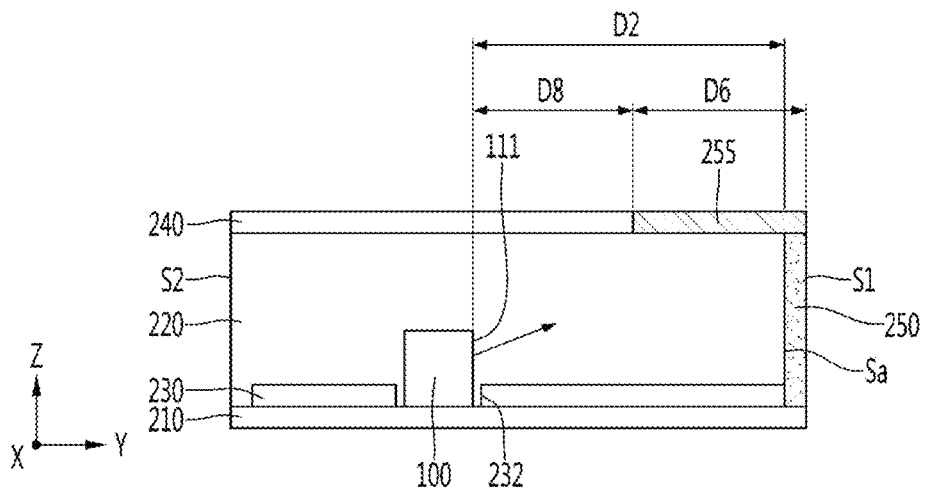
FIGS. 15 to 20 are modified examples of a cross-sectional side view of the lighting device of FIG. 14.

Referring to FIGS. 14 and 15, the lighting module may include a substrate 210, a resin layer 220, a wavelength conversion layer 250, a light emitting device 100, and at least one reflective member 230 and 240 and a first pattern layer 255. The first pattern layer 255 includes a transparent resin material, and the resin material may be selectively formed from materials of the resin layer 220. The first pattern layer 255 may include a wavelength conversion means therein. Alternatively, the first pattern layer 255 may include ink particles and a wavelength conversion means therein.

The first pattern layer 255 may be disposed to be equal to or longer than the length of the resin layer 220 in the first direction X. The first pattern layer 255 may have a length D6 smaller than the length of the resin layer 220 in the second direction Y. For example, the light emitting device 100 and the first surface S1 may be less than or equal to the distance D1 between them. The length D6 of the first pattern layer 255 in the second direction may be 2 mm or more, for example, in the range of 2 mm to 10 mm. When the wavelength conversion means is added to the first pattern layer 255, it may be smaller than the content of the wavelength conversion means added to the wavelength conversion layer 220. When a wavelength conversion means is added to the first pattern layer 255 and the wavelength conversion layer 220, for example, the wavelength conversion mean may be a phosphor or/and quantum dots that emit a wavelength of the same color, or may be a material that emits a wavelength of a different color. The first pattern layer 255 may transmit some light traveling in the direction of the first surface S1 through the resin layer 220 and may be emitted as wavelength-converted light. The first pattern layer 255 may be disposed on the first region of the resin layer 220, and thus the second reflective member 240 may be disposed on the second area of the resin layer 220. The first pattern layer 255 may vertically overlap the resin layer 220, the first reflective member 230, and the substrate 210. However, the first pattern layer 255 may not vertically overlap the light emitting device 100. The first pattern layer 255 may be in contact with the upper surface of the resin layer 220. The first pattern layer 255 may be in contact with a side surface of the second reflective member 240. The first pattern layer 255 may contact the upper surface of the wavelength conversion layer 250 or may overlap the wavelength conversion layer 250 in a vertical direction. The thickness of the first pattern layer 255 may be the same as or thinner than the thickness of the second reflective member 240. When the light emitted through the first surface S1 is the main light, the light emitted through the first pattern layer 255 may be the sub light.

Here, the second reflective member 240 may extend to a length to cover the upper surface of the light emitting device 100, and a distance D8 between a straight line perpendicular to one end of the second reflective member 240 and the light emitting surface 111 may be provided in a range of 3 mm or more, for example, 3 mm to 6 mm. Since the front end of the second reflective member 240 covers the upper portion of the light emitting device 100, a region in which a hot spot is generated on a peripheral region adjacent to the light emitting device 100 may be reduced. In FIGS. 14 and 15, the length D6 of the first pattern layer 255 in the second direction Y may be in the range of 1 to 2 times the distance D8, and for example, it may be 5 mm or more or in the range of from 10 mm to 10 mm. Since the first pattern layer 255 is spaced apart from the straight line perpendicular to the light emitting surface 111 by the distance D8, incident surface light may be guided and emitted, and hot spots may be suppressed. Here, the area of the first region in which the second reflective member 240 is disposed on the upper surface of the resin layer 220 is larger or smaller than the area of the second region in which the first pattern layer 255 is disposed, and for example, the area of the second region may be in the range of 0.6 times to 1.3 times the area of the first region.

Figure 16:
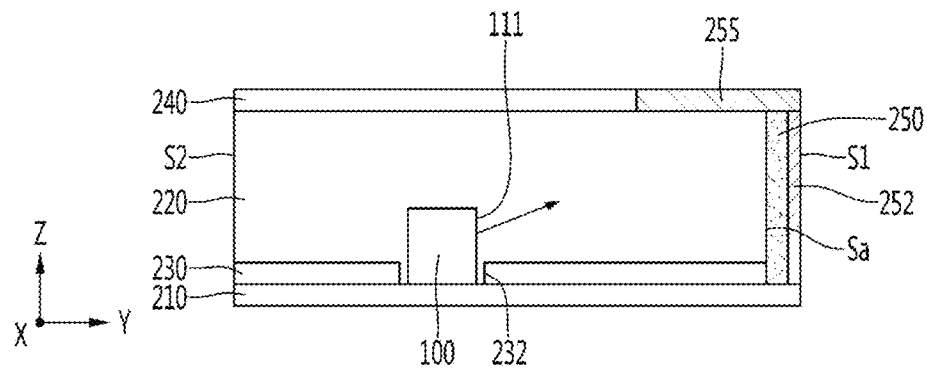

FIG. 16 is a structure in which a colored ink layer 252 is further disposed on the outer surface of the wavelength conversion layer 250 in the structure of FIG. 15. The first pattern layer 255 may be disposed on or in contact with the upper surface of the resin layer 220, or may be further disposed on the upper surface of the wavelength conversion layer 250 and/or the colored ink layer 252.

Figure 17:
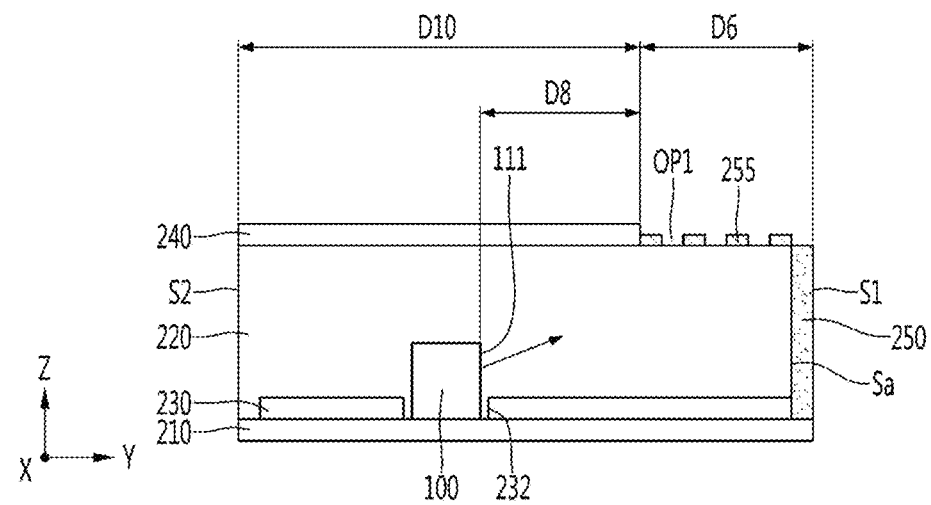

As shown in FIG. 17, the first pattern layer 255 may be formed in a pattern having a regular shape or an irregular shape. For example, the first pattern layer 255 includes at least one of a polygonal, circular, or line shape, includes a shape in which a plurality of patterns is connected to each other, and may be alternatively formed of a shape in which lines are crossed, a polygonal or circular pattern is connected by a line, or a continuous or discontinuous line pattern. The first pattern layer 255 may have a honeycomb structure, a mesh shape, or may selectively include a lattice shape, a plurality of line shapes, a plurality of polygonal shapes, a plurality of elliptical shapes, a plurality of circular shapes, and the like. The first pattern layer 255 may include a pattern having a first shape and a pattern having a second shape within the first shape. The first and second shapes may be different from each other or may have the same shape, and may be a closed loop shape continuously connected or an open loop shape having discontinuous connections. The first pattern layer 255 may include a plurality of holes OP1 therein. An upper surface of the resin layer 220 may be exposed through the hole OP1. The first pattern layer 255 may be provided to have a thickness smaller than that of the second reflective member 240. The shape of the sub-light emitted through the first pattern layer 255 by the pattern-shaped first pattern layer 255 has various shapes to match the pattern shape, and a shape of the main light which is emitted through the first surface S1, that is, the shape of light emitted through the wavelength conversion layer 250 may be a line type.

The first pattern layer 255 may not vertically overlap the second reflective member 240. A second region on the upper surface of the resin layer 220 in which the first pattern layer 255 is formed may not vertically overlap with the first region in which the second reflective member 240 is formed. The first pattern layer 255 may vertically overlap the first reflective member 230.

Figure 18:
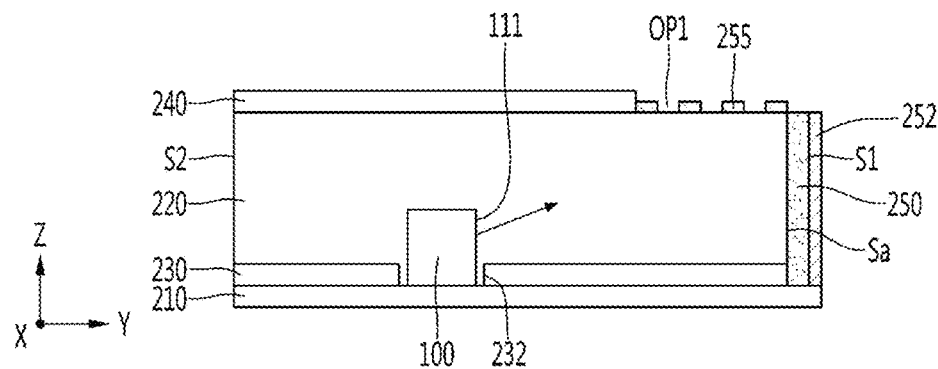

As shown in FIGS. 17 and 18, the first pattern layer 255 may or may not be disposed on the wavelength conversion layer 250 or the colored ink layer 252. The pattern of the first pattern layer 255 may be selectively formed on a plurality of resin layers by forming the pattern by a printing method. In FIG. 17, a length D10 in the second direction Y of the second reflective member 240 may be greater or less than a length D6 of the first pattern layer 255. Here, the length D6 of the first pattern layer 255 on the upper surface of the resin layer 220 may be in the range of 0.6 to 1.3 times the length D10 of the second reflective member 240 in the second direction. That is, the light guided in the resin layer 220 disposed under the second reflective member 240 may be emitted through the first pattern layer 255 and the wavelength conversion layer 250.

Figure 19:
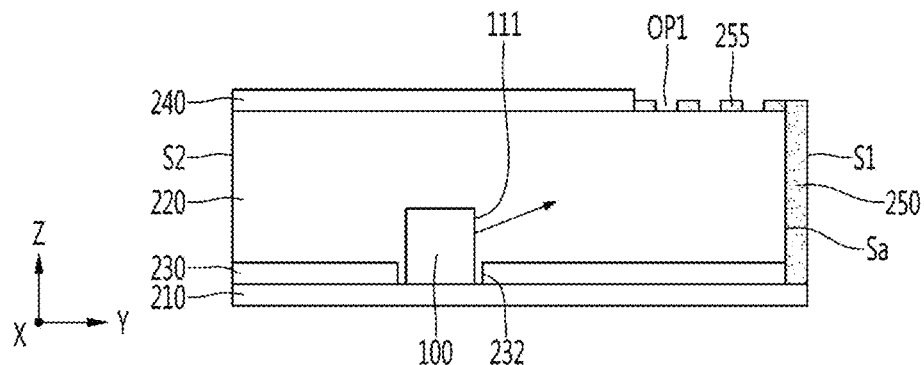
Figure 20:
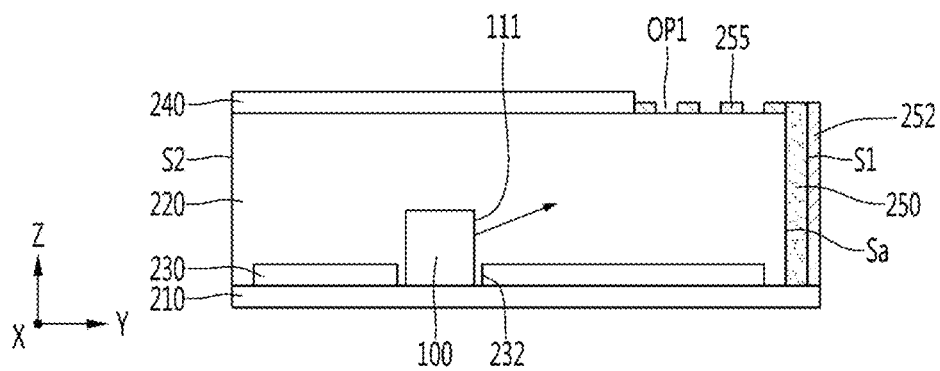

As shown in FIGS. 19 and 20, the wavelength conversion layer 250 may cover the outermost portion of the first pattern layer 255. This may be separated when the first pattern layer 255 is formed in a pattern, so that the outer side of the first pattern layer 255 may be in contact with the inner surface of the wavelength conversion layer 250.

Figure 21:
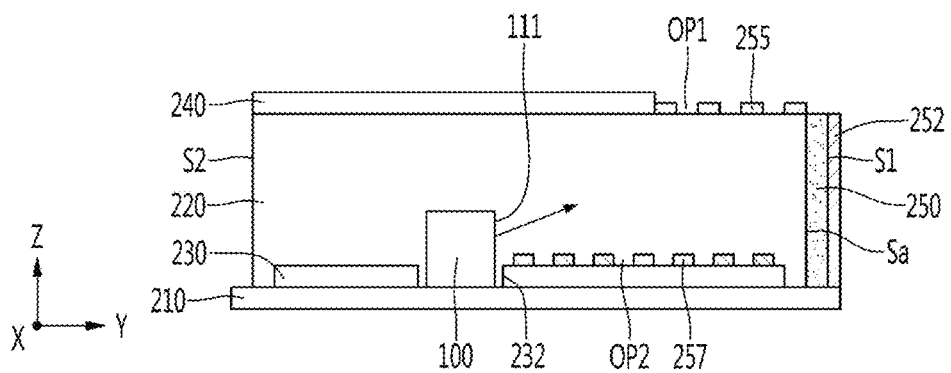
FIGS. 21 to 25 are other examples of side cross-sectional views of the lighting device of FIG. 1, 7 or 14.

As shown in FIG. 21, a second pattern layer 257 may be disposed on the first reflective member 230. The second pattern layer 257 may be selectively provided from among the materials of the resin layer 220 and may include a wavelength conversion means having at least one of a phosphor and/or quantum dots. A length of the second pattern layer 257 in the second direction may be longer than a length of the first pattern layer 255. The second pattern layer 257 may be disposed on the first reflective member 230 and disposed in a region between the light emitting surface 111 and the wavelength conversion layer 250. The second pattern layer 257 may be further disposed in a region between the light emitting devices 100. A region in which the second pattern layer 257 is formed may be larger than an area in which the first pattern layer 255 is formed. The second pattern layer 257 may be formed in a pattern having a regular shape or an irregular shape. For example, the second pattern layer 257 includes at least one of a polygonal, circular, or line shape, may include a shape in which a plurality of patterns is connected to each other, may include a shape in which the polygonal or circular patterns are connected by a line, or may be formed of continuous or discontinuous line pattern. The second pattern layer 257 may have a honeycomb structure or a mesh shape, or may selectively include a lattice shape, a plurality of line shapes, a plurality of polygonal shapes, a plurality of elliptical shapes, a plurality of circular shapes, and the like. The second pattern layer 257 may include a pattern having a first shape and a pattern having a second shape within the first shape. The first and second shapes may be different from each other or may have the same shape, and may be a closed loop shape continuously connected or an open loop shape having discontinuous connections. The second pattern layer 257 may include a plurality of holes OP2 therein. A lower surface of the resin layer 220 may be exposed through the hole OP2. The second pattern layer 257 may be provided to have a thickness smaller than that of the first reflective member 230. The second pattern layer 257 may vertically overlap the first pattern layer 255. The second pattern layer 257 may include a region overlapping the first and second reflective members 230 and 240 in a vertical direction.

Figure 35:
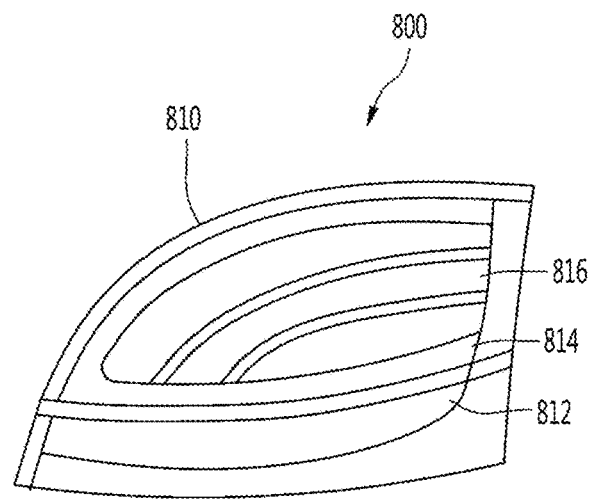
FIG. 35 is a diagram illustrating a lamp having the lighting device or lighting module of FIG. 34.

The pattern effect of the first pattern layer 255 as shown in FIGS. 17 to 21 provides various images or reduces the three-dimensional effect by the difference in luminosity between the light emitted through the hole and the light emitted through the pattern, as shown in FIG. 35. A wavelength conversion layer 250 may be disposed on the exit side of the resin layer 220 or a stacked structure of the wavelength conversion layer 250/colored ink layer 252 may be disposed on the exit side of the resin layer 220, and the first pattern layer 255 may be disposed on the peripheral region on the exit side, or the first and second pattern layers 255 and 257 may be disposed on the peripheral region on the exit side to provide the exit surface(s) in various types of surface light.

Figure 22:
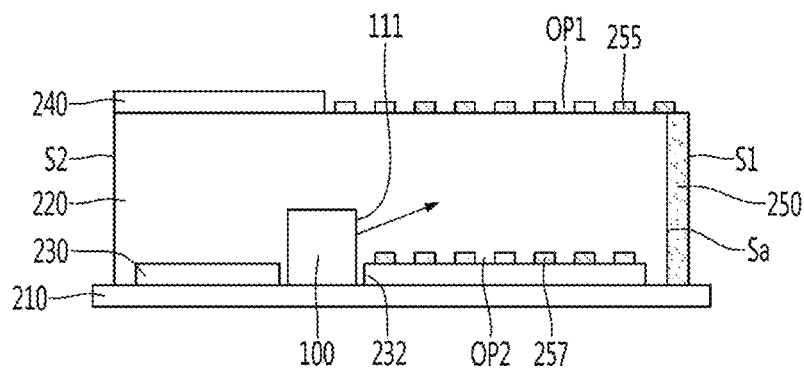
Figure 23:
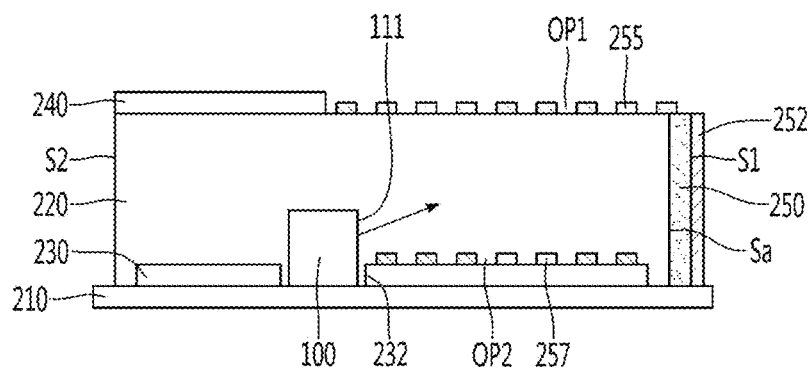

As shown in FIGS. 22 and 23, a second pattern layer 257 may be disposed on the first reflective member 230. The second pattern layer 257 may be selectively provided from among the materials of the resin layer 220 and may include a wavelength conversion means having at least one of phosphors and/or quantum dots. The second pattern layer 257 may be provided as a pattern. The pattern of the second pattern layer 257 may have a plurality of holes OP2, and a predetermined shape or an irregular shape may be repeatedly disposed. The pattern of the second pattern layer 257 may be the same as or different from the pattern of the first pattern layer 255. At least a portion of the region where the first pattern layer 255 is formed and the region of the second pattern layer 257 may overlap each other in a vertical direction. Accordingly, the pattern of the second pattern layer 257 and the pattern of the first pattern layer 255 are provided with different depths when viewed from the upper, thereby providing a three-dimensional effect. The first and second pattern layers 255 and 257 may be disposed on upper and lower surfaces of the resin layer 220. The wavelength conversion layer 220 may be disposed outside or on the exit side of the first and second pattern layers 255 and 257 to emit main light. As shown in FIG. 23, a colored ink layer 252 may be disposed outside the wavelength conversion layer 250. Here, when the second pattern layer 257 is disposed on the first reflective member 230, it may be buried inside the lower surface of the resin layer 220.

Figure 24:
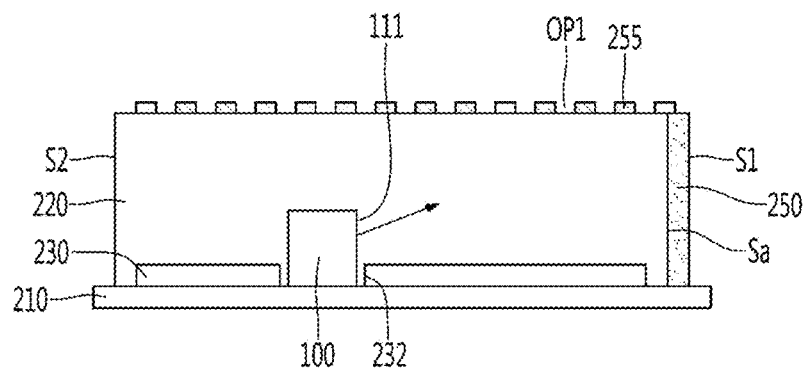
Figure 25:
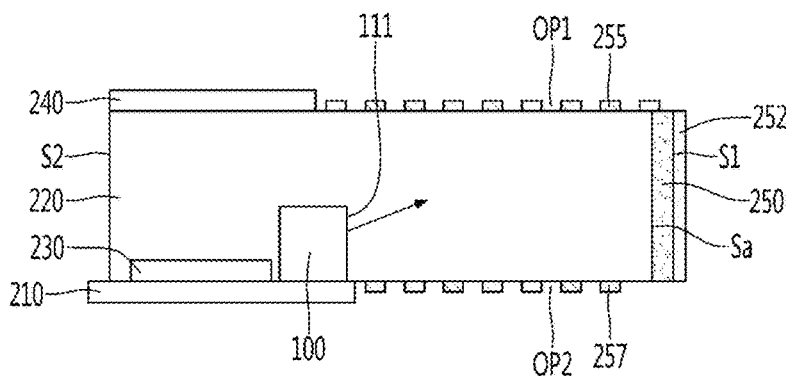
Figure 26:
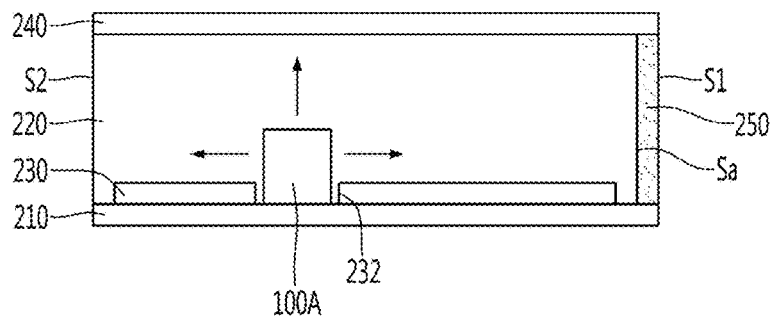
FIG. 26 is another example of a light emitting device of a lighting device according to an embodiment of the invention.

As shown in FIG. 24, the upper surface of the resin layer 220 may be exposed without the second reflective member 240. The first pattern layer 255 may be formed in a pattern on the entire upper surface of the resin layer 220. The second pattern layer 257 may be disposed under the resin layer 220, but is not limited thereto. As shown in FIG. 25, the upper and lower surfaces of the resin layer 220 on the exit side may be exposed. The pattern of the first pattern layer 255 may be disposed on the upper surface of the resin layer 220 on the exit side, and the pattern of the second pattern layer 257 may be disposed on the lower surface of the resin layer 220 on the exit side. A wavelength conversion layer 250 or a wavelength conversion layer 250 and a colored ink layer 252 may be disposed on the outer surface of the resin layer 220. The second pattern layer 257 may not overlap the light emitting device 100 in a vertical direction. 26, the light emitting device 100A may include a plurality of light emitting surfaces. The plurality of light emitting surfaces may include an upper surface and a plurality of side surfaces. The light emitting device 100A may be mounted on the substrate 210 as a flip-type LED chip or a vertical LED chip. Such a light emitting device 100A may be selectively applied to the embodiments disclosed above.

Figure 27:
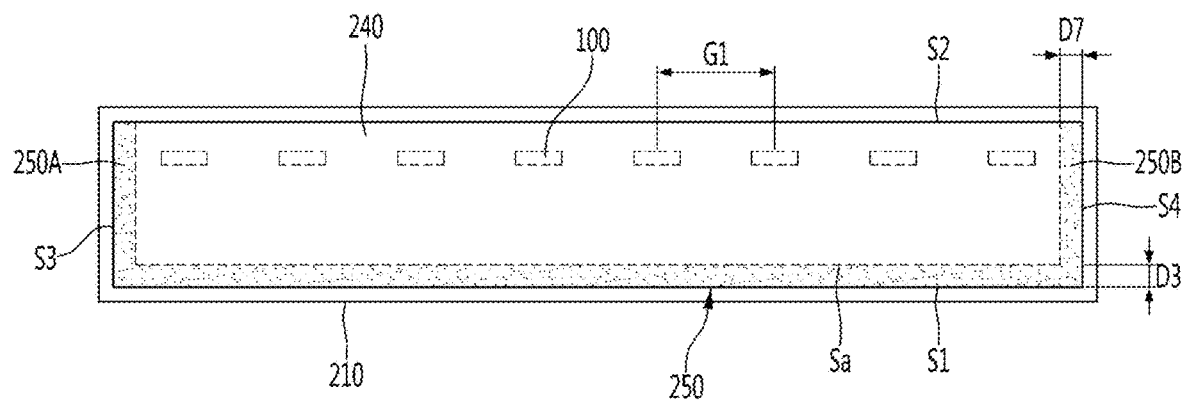
FIG. 27 is an example in which a layer in which a phosphor is formed on one surface and/or the other surface of the lighting device of FIGS. 1, 7, and 14 is extended to the third and fourth surfaces.

In FIG. 27, in the structures of FIGS. 3 and 5, the upper surface area of the substrate 210 may be provided to have a larger area than the lower surface area of the resin layer 220, so that an edge thereof may protrude to the outside. A wavelength conversion layer 250 or a colored ink layer 252 may be disposed on the entire first surface S1, third and fourth surfaces S3 and S4 of the resin layer 220, respectively. That is, at least one of the wavelength conversion layer 250 and the colored ink layer 252 disclosed above may include extension portions 250A and 250B disposed on the third and fourth surfaces S3 and S4. Here, the width D3 of the wavelength conversion layer 250 may be equal to or greater than the width D7 of the extension portions 250A and 250B. Here, the wavelength conversion layer 250 and/or the colored ink layer 252 is an example disposed under the second reflective member 240.

Figure 28:
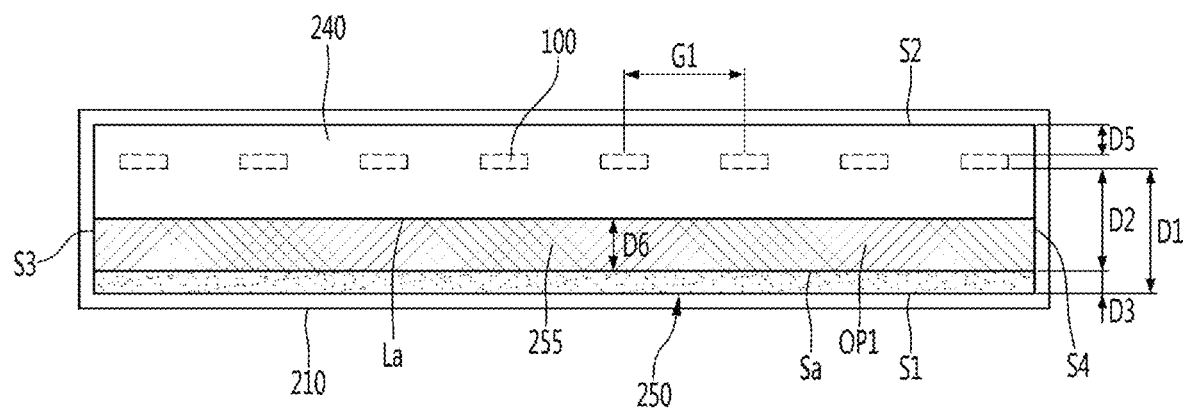
FIG. 28 is a plan view illustrating a layer having a pattern on one surface and/or the other surface of the lighting device of FIGS. 1, 7, and 14.
Figure 36:
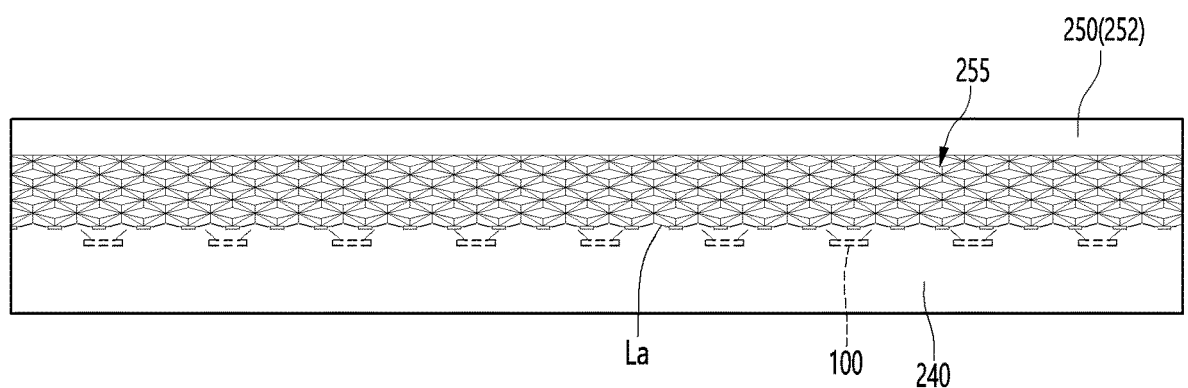
FIG. 36 is a view showing light distribution in the lighting module or lighting device of FIG. 28.

In FIG. 28, in the structure of FIGS. 14 to 20, the wavelength conversion layer 250 and/or the colored ink layer 252 may be disposed on the exit side of the resin layer 220, and the first pattern layer 255 having a pattern may be disposed on the wavelength conversion layer 250 and/or the colored ink layer 252. As shown in FIG. 36, the inner line La of the first pattern layer 255 may be a horizontal straight line, a sinusoidal wave, or a concave-convex shape. The inner line La of the first pattern layer 255 may be in contact with the second reflective member 240.

Figure 29:
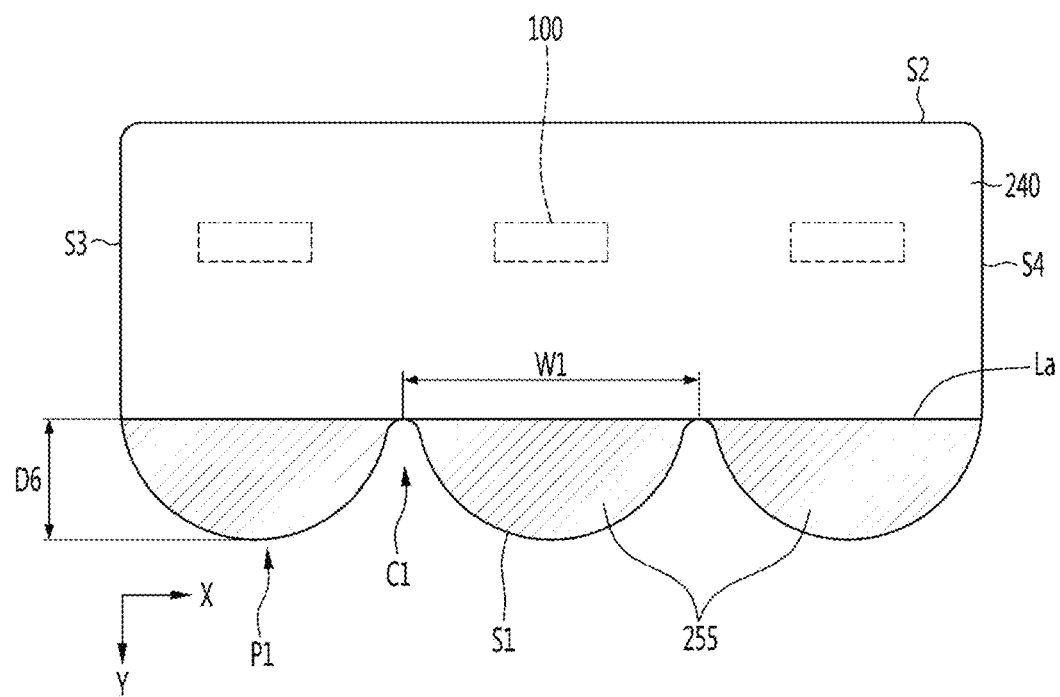
FIGS. 29 and 30 are examples of a plan view of a lighting device according to a third embodiment of the invention.
Figure 30:
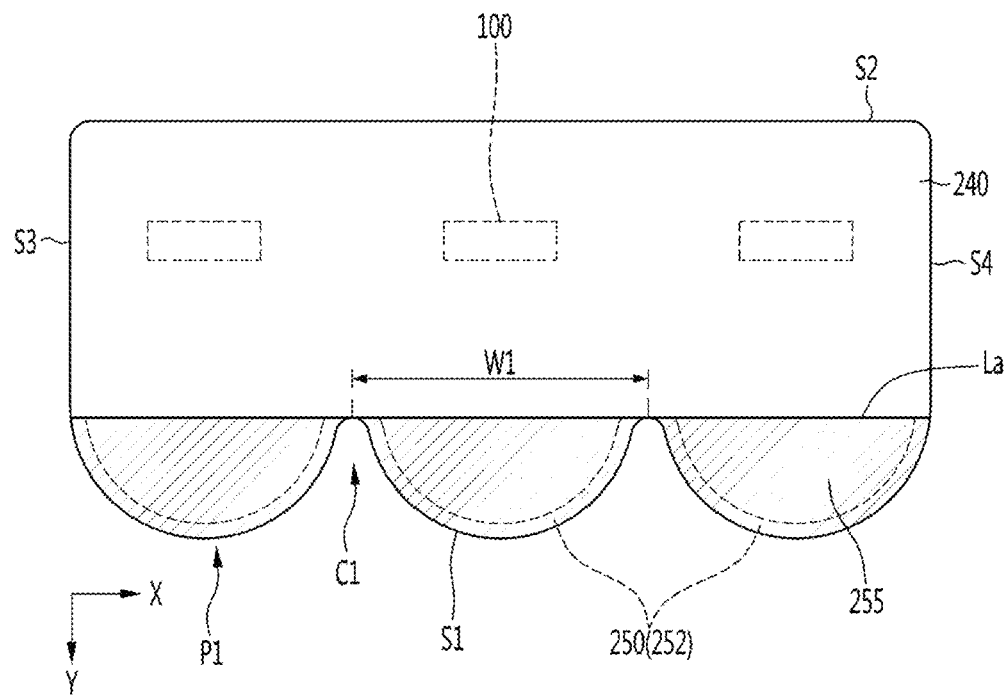

FIGS. 29 and 30 are examples in which the hemispherical convex portion P1 is disposed on the exit side of the lighting module as a third embodiment. The lighting module may include a plurality of hemispherical convex portions P1 and a concave portion C1 concave between the convex portions P1. The maximum width of the hemispherical convex portion P1 may be equal to the diameter of the convex portion P1. In this structure, the wavelength conversion layer 250 and/or the colored ink layer 252 may be selectively formed on the exit side of the resin layer 220. In addition, in this structure, a uniform linear light source from which hot spots are removed may be realized only with the wavelength conversion layer 250 even if the colored ink layer 252 is excluded. The first pattern layer 255 described above may be formed on the convex portion P1 in a pattern having a predetermined shape. The pattern may be formed up to a region adjacent to the light emitting device 100 or an upper region thereof. Since the convex portion P1 provides a convex curved surface, the incident light may be refracted to a predetermined region.

Figure 31:
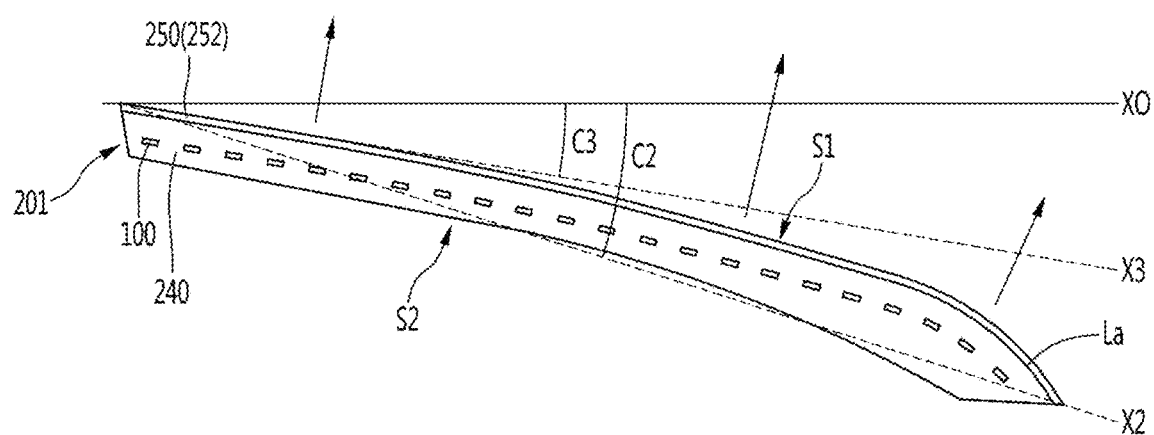
FIG. 31 is an example of a plan view of a lighting device for a vehicle lamp according to an embodiment of the invention.

FIG. 31 is a modified example of the structure when the lighting module or lighting device disclosed above is applied to a vehicle lamp. As shown in FIG. 31, the lighting module or device 201 may be provided in a curved shape based on a horizontal straight line X0. When applied to a vehicle ramp, it may be combined into a curved ramp shape extending to the rear (or front) and sides of the vehicle. The lighting module 201 may have an angle C2 in the range of 10 to 60 degrees between the straight line X0 and an imaginary straight line X2 connecting both ends of the first surface S1, and an imaginary straight line X3 extending in a tangential direction from the first surface S1 disposed at one end of the lighting module 201 may have an angle C3 in the range of 5 degrees to 30 degrees. An imaginary line connecting the adjacent light emitting devices 100 in the lighting module or device 201 may include a straight line, an oblique line, or a curved line. The wavelength conversion layer 250 may be disposed on the first surface S1, which is the exit surface, or may be disposed in a laminated structure of the wavelength conversion layer/colored ink layers 250 and 252. In addition, the first pattern layer 255 and/or the second pattern layer 257 disclosed above may be disposed.

In addition, the first surface S1 of the module or device may include a structure having a convex portion and a concave portion as shown in FIGS. 29 and 30. Also, the area of the upper surface of the substrate 210 may be equal to or greater than the area of the lower surface of the resin layer 220. Here, a portion of the line connecting the light emitting devices 100 may be disposed closer to the first surface direction than an imaginary straight line connecting the other end from one end of the first surface S1 of the lighting module 201.

Figure 32:
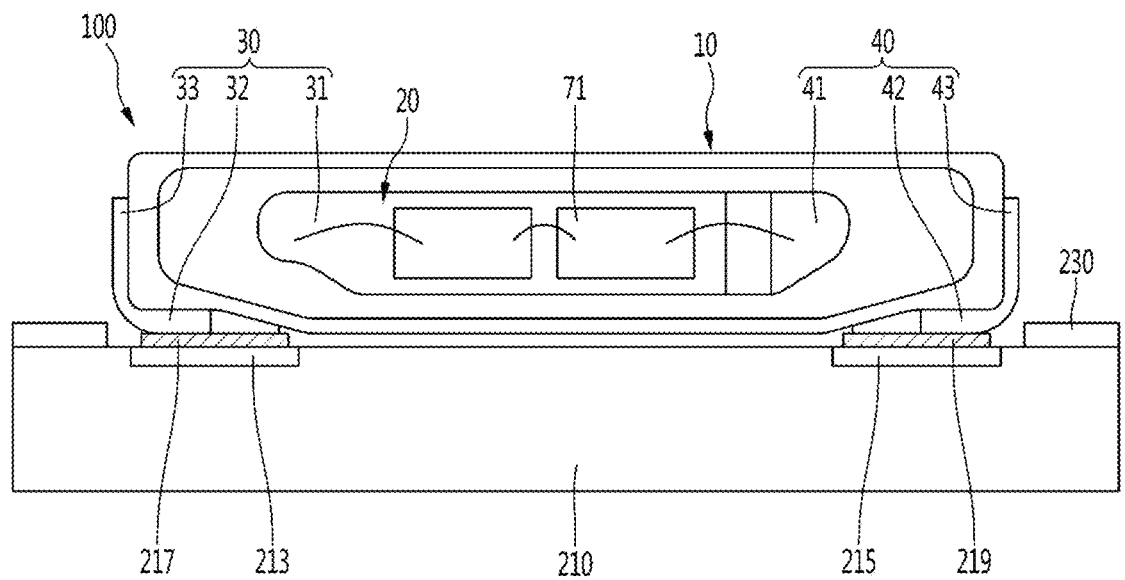
FIG. 32 is an example of a front view of a light emitting device applied to a lighting device according to an embodiment of the invention.
Figure 33:
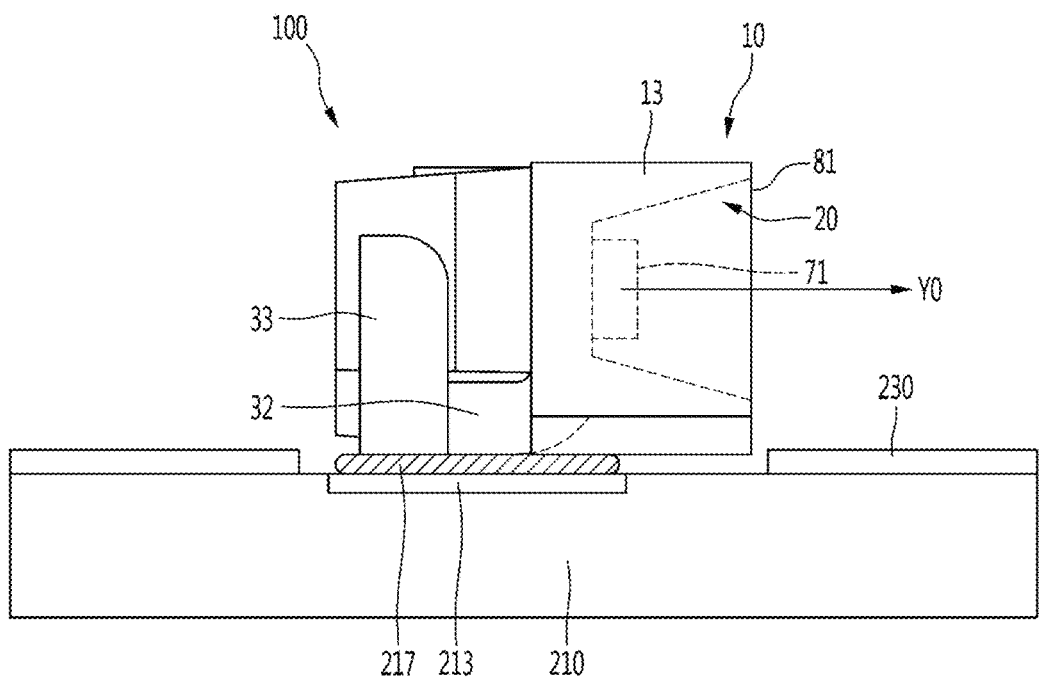
FIG. 33 is an example of a lighting device in which the light emitting device of FIG. 32 is disposed on a circuit board.

FIG. 32 is an example of a module in which a light emitting device is disposed on a circuit board in a lighting module according to an embodiment of the invention, and FIG. 33 is a view of the module viewed from the other side of FIG. 32.

Referring to FIGS. 32 and 33, the light emitting device 100 includes a body 10 having a cavity 20, a plurality of lead frames 30 and 40 in the cavity 20, and one or a plurality of light emitting chips 71 disposed on at least one of the plurality of lead frames 30 and 40. Such a light emitting device 100 is an example of the light emitting device disclosed in the above embodiment, and may be implemented as a side emission type package. The light emitting device 100 may have a length (or a length of a long side) in the first direction X that is three times or more, for example, four times or more, than a width in the second direction Y. The length of the second direction Y may be 2.5 mm or more, for example, in the range of 2.7 mm to 6 mm or in the range of 2.5 mm to 3.2 mm. The light emitting device 100 may reduce the number of the light emitting devices 100 in the first direction X by providing a longer length in the first direction X. The light emitting device 100 may provide a relatively thin thickness, thereby reducing the thickness of the lighting device having the light emitting device 100. The thickness of the light emitting device 100 may be in the range of 2 mm or less, for example, 1.5 mm or less, or 0.6 mm to 1 mm. The body 10 has a cavity 20, and the length in the first direction X may be three times or more compared to the thickness of the body 10, so as to widen the beam angle of light in the first direction X.

A plurality of lead frames 30 and 40 are disposed on the body 10. A plurality of lead frames 30 and 40 are disposed on the bottom of the cavity 20 and are coupled to the body 10. The body 10 may be formed of an insulating material. The body 10 may be formed of a reflective material. The body 10 may be formed of, for example, a resin material such as Polyphthalamide (PPA). The body 10 may be formed of a silicone-based, epoxy-based, or thermosetting resin including a plastic material, or a high heat and light resistance material. The body 10 may include a resin material to which a metal oxide is added, and the metal oxide may include at least one of TiO2, SiO2, and Al2O3. The first side portion 15 of the body 10 may be a surface on which the cavity 20 is disposed, or a surface on which light is emitted. The second side portion of the body 10 may be the opposite side of the first side portion 15 or the second side. The first lead frame 30 includes a first lead part 31, a first bonding part 32, and a first heat dissipation part 33. The second lead frame 40 includes a second lead part 41, a second bonding part 42, and a second heat dissipation part 43. The gap portion 17 between the first and second lead portions 31 and 41 may be formed of a material of the body 10. As another example, two or more or three lead frames are coupled within the body 10, and any one may be a heat dissipation frame. Here, the light emitting chip 71 may be disposed on the first lead part 31 of the first lead frame 30, for example, and may be connected to the first and second lead parts 31 and 41 by the wires 72 and 73, or may be connected to the first lead part 31 with an adhesive and connected to the second lead part 41 by wire. The light emitting chip 71 may be a horizontal chip, a vertical chip, or a chip having a via structure. The light emitting chip 71 may be mounted in a flip chip method. The light emitting chip 71 may selectively emit light within a wavelength range of ultraviolet to visible light. The light emitting chip 71 may emit, for example, ultraviolet or blue peak wavelength. The light emitting chip 71 may include at least one of a group II-VI compound and a group III-V compound. A plurality of light emitting chips 71 may be connected in series or a plurality of light emitting chips 71 may be connected in parallel. The light emitting chip 71 may be selected from, for example, a red LED chip, a blue LED chip, a green LED chip, and a yellow green LED chip. A molding member 81 is disposed in the cavity 20 of the body 11, and the molding member 81 includes a light-transmitting resin such as silicone or epoxy, and may be formed in a single layer or in multiple layers. A phosphor for changing a wavelength of emitted light may be included on the molding member 81 or the light emitting chip 71. As another example, a light-transmitting film having a phosphor and/or an optical lens may be further formed on the cavity 20. A semiconductor device such as a light receiving device and a protection device may be mounted in the light emitting device.

Referring to FIG. 33, at least one or a plurality of light emitting devices 100 are disposed on a substrate 210, and a protective layer and/or a first reflective member 230 is disposed around a lower portion of the light emitting device 100. do. The light emitting device 100 emits light in the central axis Y0 direction, and may be applied to the lighting device. The first and second lead portions 33 and 43 of the light emitting device 100 are bonded to the electrode patterns 213 and 215 of the substrate 210 with solder or conductive tape as conductive adhesive members 217 and 219.

Figure 34:
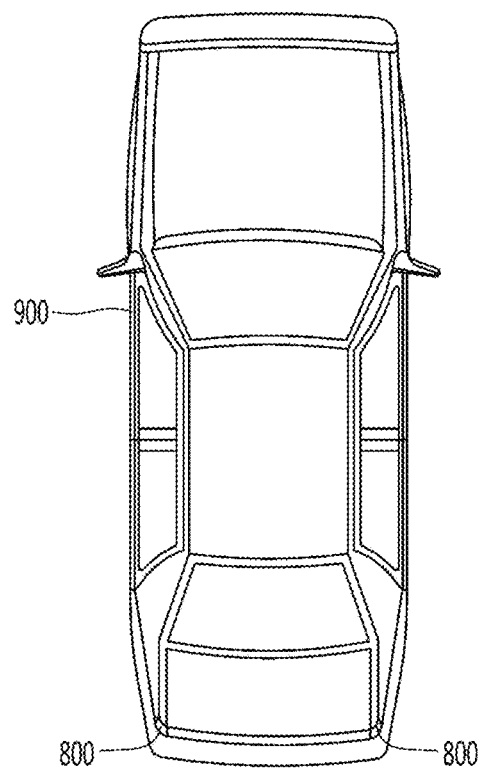
FIG. 34 is a plan view of a vehicle to which a lighting device or a lamp having a lighting device according to an embodiment of the invention is applied.
Figure 34:
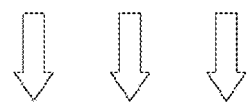

FIG. 34 is a plan view of a vehicle to which a vehicle lamp to which a lighting module is applied according to an embodiment is applied, and FIG. 35 is a view showing a vehicle lamp having a lighting module or a lighting device disclosed in the embodiment. Referring to FIGS. 34 and 35, the tail light 800 in the vehicle 900 may include a first lamp unit 812, a second lamp unit 814, a third lamp unit 816, and a housing 810. Here, the first lamp unit 812 may be a light source serving as a turn indicator, the second lamp unit 814 may be a light source serving as a sidelight, and the third lamp unit 816 may be a light source serving as a brake light, but is not limited thereto. At least one or all of the first to third lamp units 812, 814, and 816 may include the lighting device or module disclosed in the embodiment. The housing 810 accommodates the first to third lamp units 812, 814, and 816, and may be made of a light-transmitting material. In this case, the housing 810 may have a curve according to the design of the vehicle body, and the first to third lamp units 812, 814, and 816 implement a surface light source that may have a curved surface according to the shape of the housing 810. Such a vehicle lamp may be applied to a turn signal lamp of a vehicle when the lamp unit is applied to a tail lamp, a brake lamp, or a turn signal lamp of a vehicle.

The lighting device of the invention may have a thin thickness and may improve the luminous intensity of light emitted through at least one side surface, and may provide wavelength-converted light through at least one side surface of the resin layer. The lighting device of the invention may provide wavelength-converted light through at least one side, one side, and/or the other side of the resin layer. The invention may extract wavelength-converted light and/or light emitted from the light emitting device through the emitting surface of the resin layer and the upper surface adjacent to the emitting surface. In the invention, since a thin-walled lighting module or device provides surface light in the form of line light, the degree of design freedom may be increased and the light uniformity of the surface light may be improved. The invention may improve the optical reliability of a lighting module and a lighting device having the same. Reliability of a vehicle lighting device having the lighting module may be improved, and the lighting device may be applied to a light unit, various types of display devices, or vehicle lamps.

Features, structures, effects, etc. described in the above embodiments are included in at least one embodiment of the invention, and are not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and modifications should be interpreted as being included in the scope of the invention.

Technical Problem

An embodiment of the invention provides a lighting module for emitting light emitted from a plurality of light emitting devices in the form of a line. An embodiment of the invention provides a lighting module or lighting device having a first light emitting surface having a line width or a line height. An embodiment of the invention provides a lighting module or lighting device having an exit surface on at least one side of a resin layer, or an exit surface on at least one of one side and the other side of the resin layer. An embodiment of the invention provides a lighting module or lighting device including a layer having a wavelength conversion means on at least one side and an upper surface or/and a lower surface of a resin layer having a line height. An embodiment of the invention provides a lighting module or lighting device including a layer(s) having a wavelength conversion means and/or ink particles on at least one side of a resin layer. An embodiment of the invention provides a lighting module or a lighting device in which a reflective member is disposed on the upper surface and/or the lower surface of a resin layer on which a plurality of light emitting devices are disposed, and a layer having impurities is disposed on one side, upper surface, and/or lower surface of the resin layer. An embodiment of the invention provides a lighting module for irradiating side light or surface light in the form of a line, and a lighting device having the same. Embodiments of the invention may provide a light unit having a lighting module, a liquid crystal display, and a vehicle lamp.

Technical Solution

A lighting device according to an embodiment of the invention comprises a substrate; a plurality of light emitting devices disposed on the substrate; a first reflective member disposed on the substrate; a resin layer disposed on the first reflective member; a second reflective member disposed on the resin layer; and a wavelength conversion layer disposed on one surface of the resin layer opposite to the light emitting surface of the light emitting devices, wherein a distance between the light emitting surface and the one surface may be 5 to 10 times a height of the resin layer.

A lighting device according to an embodiment of the invention comprises: a substrate; a plurality of light emitting devices disposed on the substrate; a first reflective member disposed on the substrate; a resin layer disposed on the first reflective member; a second reflective member disposed on a first region of the resin layer; a first pattern layer disposed on a second region of the resin layer; and a wavelength conversion layer disposed on one surface of the resin layer opposite to the light emitting surface of the light emitting devices, wherein the first pattern layer may include at least one of a polygonal shape, a circular shape, and a line shape.

According to an embodiment of the invention, the polygonal or circular shape of the first pattern layer may be formed of a line. The first pattern layer may include a plurality of patterns connected to each other. The plurality of patterns may include a honeycomb structure pattern. The first pattern layer may have a first shape and a second shape different from the first shape and disposed within the first shape. The first pattern layer and the plurality of light emitting devices may not overlap in a vertical direction. The second reflective member may overlap the light emitting device in the vertical direction. According to an embodiment of the invention, the area of the second region may be larger than that of the first region. An area of the second region may be 0.6 to 1.3 times that of the first region. A second pattern layer disposed on one region of the second reflective member may be included, and the first pattern layer and the second pattern layer may include a predetermined shape or an irregular pattern. The shape of the pattern of the first pattern layer and the shape of the pattern of the second pattern layer may be different from each other. One pattern region of the first pattern layer may overlap in a direction perpendicular to one pattern region of the second pattern layer.

A lighting device according to an embodiment of the invention comprises: a substrate; a plurality of light emitting devices disposed on the substrate; a first reflective member disposed on the substrate; a resin layer disposed on the first reflective member; a second reflective member disposed on the first region on the resin layer; a wavelength conversion layer disposed on one surface of the resin layer opposite to the light emitting surface of the light emitting devices; and a second pattern layer disposed on one region of the first reflective member, wherein the second pattern layer may include at least one of a polygonal shape, a circular shape, and a line shape.

According to an embodiment of the invention, the second pattern layer may be disposed in front of the light emitting surfaces of the plurality of light emitting devices. The second pattern layer may be molded by the resin layer. The first region may not overlap the second pattern layer in a vertical direction.

A lighting device according to an embodiment of the invention comprises: a substrate; a plurality of light emitting devices disposed on the substrate; a first reflective member disposed on the substrate; a resin layer disposed on the first reflective member; a second reflective member disposed on a first region on the resin layer; a wavelength conversion layer disposed on one surface of the resin layer opposite to the light emitting surface of the light emitting devices; and a pattern layer disposed on at least one of one region of the first reflective member and one region on the resin layer, wherein the shape of light emitted from the light emitting device and passing through the pattern layer may include at least one of a polygonal shape or a circular shape.

According to an embodiment of the invention, a colored ink layer disposed on the wavelength conversion layer may be included. The colored ink layer may include red ink. According to an embodiment of the invention, one surface of the resin layer and the wavelength conversion layer include a plurality of convex portions and a concave portion formed between the plurality of convex portions, and each of the plurality of convex portions may correspond to a location of each of the plurality of light emitting devices.

According to an embodiment of the invention, the plurality of light emitting devices may include a side view type LED, and the first reflective member may include a plurality of holes in which the side view type LEDs are disposed. The plurality of light emitting devices may be disposed to be spaced apart by a first distance in one row. A distance from the light emitting surface to the one surface may correspond to the first distance. The first distance may be 10 mm to 15 mm, and the height of the resin layer may be 1.5 mm to 1.6 mm. According to an embodiment of the invention, one surface of the resin layer may include a curvature. The shape of light emitted from the light emitting device and passed through the wavelength conversion layer may be a line shape.

Advantageous Effects

According to an embodiment of the invention, the luminous intensity of light emitted through at least one side surface of a lighting module having a thin thickness may be improved. According to an embodiment of the invention, the wavelength-converted light may be provided through at least one side surface of the resin layer of the lighting module, or the wavelength-converted light may be provided through at least one side and one surface and/or the other surface of the resin layer. According to an embodiment of the invention, wavelength-converted light and/or light emitted from the light emitting device may be extracted through the emitting surface of the resin layer and the upper surface adjacent to the emitting surface. According to an embodiment of the invention, since the thin-thickness lighting module is provided in the form of line light, the degree of freedom in design may be increased and the light uniformity of the emitted surface light may be improved. It is possible to improve the optical reliability of the lighting module and the lighting device having the same according to an embodiment of the invention. The lighting module according to an embodiment of the invention may be applied to a vehicle lighting device, a light unit, various types of display devices, and an electric sign board.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lighting device comprising:
   a substrate;
   a light emitting device disposed on an upper surface of the substrate;
   a resin layer disposed on the upper surface of the substrate and covering the light emitting device; and
   a reflective member disposed on an upper surface of the resin layer,
   wherein the light emitting device is a side view type package,
   wherein the resin layer has the upper surface with a plurality of patterns,
   wherein a first portion of the resin layer does not overlap with the reflective member in a direction perpendicular to the upper surface of the substrate,
   wherein the light emitting device has a second portion and a third portion,
   wherein the second portion of the light emitting device overlaps with the reflective member and the third portion of the light emitting device does not overlap with the reflective member in the direction perpendicular to the upper surface of the substrate,
   wherein the first portion of the resin layer overlaps with the third portion of the light emitting device in the direction perpendicular to the upper surface of the substrate, and
   wherein a width of the light emitting device is greater than a width of each of the plurality of patterns.

2. The lighting device of claim 1,
   wherein the reflective member is formed of a light blocking layer.

3. The lighting device of claim 1,
   wherein a width of the reflective member is greater than the width of the light emitting device.

4. The lighting device of claim 2,
   wherein the reflective member has a multi-layer structure.

5. The lighting device of claim 1,
   wherein a thickness of the plurality of patterns is smaller than a thickness of the reflective member.

6. The lighting device of claim 1, comprising:
   a reflective material disposed on an upper surface of the substrate and being in contact with a lower surface of the resin layer.

7. The lighting device of claim 1,
wherein each of the plurality of patterns has a regular shape.

8. The lighting device of claim 1,
wherein each of the plurality of patterns includes a first pattern having a closed loop shape.

9. The lighting device of claim 8,
wherein the first pattern of each of the plurality of patterns has a hollow.

10. The lighting device of claim 8,
wherein each of the plurality of patterns includes a second pattern and a shape of the second pattern is different from a shape of the first pattern.

11. The lighting device of claim 8,
wherein each of the plurality of patterns includes a second pattern and the second pattern of each the plurality of patterns is disposed within the first pattern of each of the plurality of patterns.

12. The lighting device of claim 1,
wherein the lighting device includes a plurality of the light emitting devices and an imaginary line connecting the adjacent light emitting devices include a straight line and an oblique line.

13. The lighting device of claim 1,
wherein a width of the reflective member is greater than the width of each of the plurality of patterns.

14. The lighting device of claim 1,
wherein the substrate has a first width and a second width, and the first width is different from the second width.

15. The lighting device of claim 1,
wherein the lighting device includes a plurality of the light emitting devices,
wherein a distance between an outmost light emitting device of the plurality of light emitting devices and at least one side surface of the resin layer is smaller than a pitch between the plurality of light emitting devices.

16. The lighting device of claim 1,
a distance between the plurality of patterns is narrower than a width of the reflective member.

17. The lighting device of claim 1,
wherein the resin layer has first and second surfaces opposite to each other,
wherein the light emitting device has a first side surface and a second side surface opposite to each other,
wherein the first surface and the first side surface face each other,
wherein the second surface and the second side surface face each other,
wherein a distance between the first surface of the resin layer and the first side surface of the light emitting device is wider than a distance between the second surface of the resin layer and the second side surface of the light emitting device.

18. A lighting device comprising:
a substrate;
a light emitting device disposed on an upper surface of the substrate;
a resin layer disposed on the upper surface of the substrate and covering the light emitting device; and
a reflective member disposed on an upper surface of the resin layer,
wherein the light emitting device is side view type packages that emit light toward a side surface of the resin layer,
wherein the resin layer has a plurality of patterns on an upper surface of the resin layer,
wherein a region of the resin layer does not overlap with the reflective member in a direction perpendicular to the upper surface of the substrate,
wherein the light emitting device has a first region and a second region,
wherein the first region of the light emitting device overlaps with the reflective member and the second region of the light emitting device does not overlap with the reflective member in the direction perpendicular to the upper surface of the substrate,
wherein the region of the resin layer overlaps with the second region of the light emitting device, and
wherein a width of the reflective member is greater than a width of each of the plurality of patterns.

19. The lighting device of claim 18,
wherein each of the plurality of patterns of the resin layer has a first pattern and a second pattern within the first pattern, and a shape of the first pattern is different from a shape of the second pattern.

20. The lighting device of claim 18,
wherein each of the plurality of patterns of the resin layer has a first pattern and the first pattern of each of the plurality of patterns has a closed loop shape.

* * * * *